US012597872B2

(12) United States Patent
Miyazaki et al.

(10) Patent No.: US 12,597,872 B2
(45) Date of Patent: Apr. 7, 2026

(54) ELECTROSTATIC CHUCK AND METHOD OF MANUFACTURING THE SAME

(71) Applicant: TOTO LTD., Fukuoka (JP)

(72) Inventors: Shunya Miyazaki, Fukuoka (JP); Jun Shiraishi, Fukuoka (JP); Yutaka Momiyama, Fukuoka (JP); Ikuo Itakura, Fukuoka (JP)

(73) Assignee: TOTO LTD., Fukuoka (JP)

( * ) Notice: Subject to any disclaimer, the term of this patent is extended or adjusted under 35 U.S.C. 154(b) by 142 days.

(21) Appl. No.: 18/443,441

(22) Filed: Feb. 16, 2024

(65) Prior Publication Data

US 2024/0283379 A1 Aug. 22, 2024

(30) Foreign Application Priority Data

Feb. 22, 2023 (JP) ................................. 2023-025982
Feb. 22, 2023 (JP) ................................. 2023-025984
Feb. 22, 2023 (JP) ................................. 2023-025986

(51) Int. Cl.
    *H02N 13/00* (2006.01)
    *C23C 16/458* (2006.01)
(52) U.S. Cl.
    CPC .......... *H02N 13/00* (2013.01); *C23C 16/458* (2013.01)
(58) Field of Classification Search
    CPC .. H02N 13/00; C23C 16/458; C23C 16/4586; H01L 21/67109; H01L 21/6831; H01L 21/6833; H01L 21/68757
    See application file for complete search history.

(56) References Cited

U.S. PATENT DOCUMENTS

| | | | |
|---|---|---|---|
| 6,494,955 B1 | 12/2002 | Lei et al. | |
| 6,639,783 B1 * | 10/2003 | Shamouilian | .......... H02N 13/00 |
| | | | 279/128 |
| 8,525,418 B2 * | 9/2013 | Morita | ................ H01L 21/6831 |
| | | | 219/390 |
| 10,512,125 B2 * | 12/2019 | Kitagawa | .......... H01L 21/67103 |
| 10,832,931 B2 | 11/2020 | Mangalore et al. | |
| 11,201,076 B2 * | 12/2021 | Hayahara | ............ H01L 21/6831 |
| 11,728,145 B2 * | 8/2023 | Satake | .............. H01L 21/67103 |
| | | | 156/345.52 |

(Continued)

FOREIGN PATENT DOCUMENTS

| | | |
|---|---|---|
| JP | H06-112302 A | 4/1994 |
| JP | H09-148420 A | 6/1997 |

(Continued)

*Primary Examiner* — Thienvu V Tran
*Assistant Examiner* — Muaamar Qahtan Al-Taweel
(74) *Attorney, Agent, or Firm* — Finnegan, Henderson, Farabow, Garrett & Dunner LLP

(57) ABSTRACT

An electrostatic chuck includes: a dielectric substrate on which at least one first gas hole is formed; a base plate on which at least one second gas hole is formed; and a joining layer which is provided between the dielectric substrate and the base plate and which is formed of an insulating material. A first opening being an end of the at least one first gas hole is formed on a surface of the dielectric substrate. A second opening being an end of the at least one second gas hole is formed at a position which differs from the at least one first opening on a surface of the base plate. A communication groove is formed on the surface of the base plate.

15 Claims, 23 Drawing Sheets

(56)    References Cited

U.S. PATENT DOCUMENTS

| | | | |
|---|---|---|---|
| 2005/0105243 A1* | 5/2005 | Lee | H01L 21/6833 |
| | | | 361/234 |
| 2006/0076108 A1 | 4/2006 | Holland et al. | |
| 2010/0002355 A1 | 1/2010 | Morooka | |
| 2013/0021717 A1 | 1/2013 | Singh | |
| 2013/0308244 A1* | 11/2013 | Shiraiwa | H02N 13/00 |
| | | | 361/234 |
| 2020/0243355 A1 | 7/2020 | Makabe | |
| 2021/0272834 A1 | 9/2021 | Takayama | |

FOREIGN PATENT DOCUMENTS

| | | | |
|---|---|---|---|
| JP | 2002-093894 A | 3/2002 | |
| JP | 2004-006505 A | 1/2004 | |
| JP | 2005-203426 A | 7/2005 | |
| JP | 2007035878 A | 2/2007 | |
| JP | 2010-016363 A | 1/2010 | |
| JP | 2014-522103 A | 8/2014 | |
| JP | 2018-107313 A | 7/2018 | |
| JP | 2020-120081 A | 8/2020 | |
| JP | 2021-141116 A | 9/2021 | |
| JP | 2022-048089 A | 3/2022 | |
| JP | 2022-176701 A | 11/2022 | |
| KR | 10-2006-0052119 A | 5/2006 | |
| KR | 10-2011-0099974 A | 9/2011 | |
| KR | 10-2017-0015382 A | 2/2017 | |

* cited by examiner

ELECTROSTATIC CHUCK AND METHOD OF MANUFACTURING THE SAME

CROSS-REFERENCE TO RELATED APPLICATION

This application is based upon and claims the benefit of priority from Japanese Patent Applications No. 2023-025982 filed on Feb. 22, 2023, No. 2023-025984 filed on Feb. 22, 2023, and No. 2023-025986 filed on Feb. 22, 2023, the entire contents of which are incorporated herein by reference.

BACKGROUND OF THE INVENTION

Field of the Invention

The present invention relates to an electrostatic chuck and a method of manufacturing the electrostatic chuck.

Description of the Related Art

Semiconductor manufacturing equipment such as a CVD device is provided with an electrostatic chuck as a device for attracting and holding a substrate such as a silicon wafer to be a processing object. The electrostatic chuck includes a dielectric substrate provided with an attracting electrode and a base plate which supports the dielectric substrate and is configured such that the dielectric substrate and the base plate are joined to each other. While an attracting electrode is generally built into a dielectric substrate, as described in Japanese Patent Laid-Open No. 2005-203426, there are cases where a base plate made of metal is used as an attracting electrode. When voltage is applied to the attracting electrode, an electrostatic force is created and a substrate placed on the dielectric substrate is attracted and held.

An inert gas such as helium is often supplied between a dielectric substrate and a substrate for the purpose of regulating a temperature or the like of the substrate during processing. Gas holes are respectively formed in the dielectric substrate and the base plate as a supply path of such a gas.

In the configuration described in Japanese Patent Laid-Open No. 2005-203426, the gas holes are formed so as to linearly penetrate a joint portion of the dielectric substrate and the base plate in a direction perpendicular to a joined surface. While metal is exposed on an inner surface of gas holes provided in the base plate, the exposed metal opposes the substrate through the linear gas holes. Therefore, in the electrostatic chuck configured as described above, a discharge between the substrate and the base plate occurs relatively readily along the linear gas holes.

The present invention has been made in consideration of the problem described above and an object thereof is to provide an electrostatic chuck which is capable of suppressing an occurrence of a discharge via a gas hole and a method of manufacturing the electrostatic chuck.

SUMMARY OF THE INVENTION

As an aspect for solving the problem described above, an electrostatic chuck according to the present invention includes: a dielectric substrate on which at least one first gas hole is formed; a base plate on which at least one second gas hole is formed; and a joining layer which is provided between the dielectric substrate and the base plate and which is formed of an insulating material. At least one first opening being an end of the at least one first gas hole is formed on a surface of the dielectric substrate on a side of the joining layer. At least one second opening being an end of the at least one second gas hole is formed at a position which differs from the at least one first opening on a surface of the base plate on a side of the joining layer. A communication groove which communicates the at least one first opening and the at least one second opening with each other is formed on the surface of the base plate on the side of the joining layer.

In the electrostatic chuck configured as described above, the at least one first opening being an end of the at least one first gas hole and the at least one second opening being an end of the at least one second gas hole are at mutually different positions and the at least one first opening and the at least one second opening are communicated with each other by the communication groove provided on the base plate. The term "positions" described above refers to, for example, positions of the at least one first opening and the at least one second opening when viewed from a direction perpendicular to the joined surface.

In such a configuration, an inner surface of the at least one second gas hole is never exposed toward a side of the substrate directly under the at least one first gas hole. Since a longer creepage distance of a path from metal exposed on the inner surface of the at least one second gas hole through the at least one first gas hole to the substrate is secured as compared to conventional configurations, an occurrence of a discharge along the path can be suppressed.

In addition, in the electrostatic chuck according to the present invention, the at least one first opening includes a plurality of first openings, the at least one second opening includes a plurality of second openings, and the at least one second opening is also preferably communicated with the plurality of first openings via the communication groove. In such a configuration, the number of second openings can be made smaller than the number of first openings. By reducing the number of second openings which may trigger a discharge, an occurrence of a discharge can be further suppressed.

Furthermore, in the electrostatic chuck according to the present invention, an insulator film is also preferably provided on an inner surface of the communication groove of the base plate. In such a configuration, since a metal surface of the base plate is not exposed in a portion directly under the at least one first opening, the occurrence of a discharge can be further suppressed.

In addition, in the electrostatic chuck according to the present invention, the insulator film is also preferably a film formed by spraying. In such a configuration, a film with high insulation properties can be readily formed and the occurrence of a discharge can be suppressed.

Furthermore, in the electrostatic chuck according to the present invention, the joining layer is also preferably a layer created by curing a solid adhesive sheet. In such a configuration, a situation where an uncured adhesive penetrates into the communication groove or blocks the communication groove during a process of curing the adhesive can be reliably prevented.

A method of manufacturing an electrostatic chuck according to the present invention includes the steps of: preparing a dielectric substrate on which at least one first gas hole and at least one first opening being an end of the at least one first gas hole are formed; preparing a base plate on which at least one second gas hole and a communication groove which connects to at least one second opening being an end of the at least one second gas hole are formed; preparing a solid adhesive sheet which is an insulating member; causing a surface of the dielectric substrate on which the at least one first opening is formed and a surface of the base plate on which the at least one second opening is formed to oppose each other so that the at least one first opening and the at least one second opening at mutually different positions are communicated with each other by the communication groove and sandwiching an adhesive sheet between the dielectric substrate and the base plate; and curing the adhesive sheet.

According to such a method of manufacturing an electrostatic chuck, an electrostatic chuck capable of suppressing an occurrence of a discharge via a gas hole as described above can be readily manufactured.

As another aspect for solving the problem described above, an electrostatic chuck according to the present invention includes: a dielectric substrate on which at least one first gas hole is formed; a base plate on which at least one second gas hole is formed; and a joining layer which is provided between the dielectric substrate and the base plate and which is formed of an insulating material. At least one first opening being an end of the at least one first gas hole is formed on a surface of the dielectric substrate on a side of the joining layer. At least one second opening being an end of the at least one second gas hole is formed at a position which differs from the at least one first opening on a surface of the base plate on a side of the joining layer. A communication groove which communicates the at least one first opening and the at least one second opening with each other is formed on the surface of the dielectric substrate on the side of the joining layer.

In the electrostatic chuck configured as described above, the at least one first opening being an end of the at least one first gas hole and the at least one second opening being an end of the at least one second gas hole are at mutually different positions and the at least one first opening and the at least one second opening are communicated with each other by the communication groove provided on the dielectric substrate. The term "positions" described above refers to, for example, positions of the at least one first opening and the at least one second opening when viewed from a direction perpendicular to the joined surface.

In such a configuration, an inner surface of the at least one second gas hole is never exposed toward a side of the substrate directly under the at least one first gas hole. Since a longer creepage distance of a path from metal exposed on the inner surface of the at least one second gas hole through the at least one first gas hole to the substrate is secured as compared to conventional configurations, an occurrence of a discharge along the path can be suppressed.

In addition, in the electrostatic chuck according to the present invention, the at least one first opening includes a plurality of first openings, the at least one second opening includes a plurality of second openings, and the at least one second opening is also preferably communicated with the plurality of first openings via the communication groove. In such a configuration, the number of second openings can be made smaller than the number of first openings. By reducing the number of second openings which may trigger a discharge, an occurrence of a discharge can be further suppressed.

Furthermore, in the electrostatic chuck according to the present invention, an insulator film is also preferably provided on the surface of the base plate on the side of the joining layer. In such a configuration, since the surface of the base plate becomes covered by both the joining layer and the insulator film, an occurrence of a discharge can be further suppressed.

In addition, in the electrostatic chuck according to the present invention, the insulator film is also preferably a film formed by spraying. In such a configuration, a film with high insulation properties can be readily formed and the occurrence of a discharge can be suppressed.

Furthermore, in the electrostatic chuck according to the present invention, the joining layer is also preferably a layer created by curing a solid adhesive sheet. In such a configuration, a situation where an uncured adhesive penetrates into the communication groove or blocks the communication groove during a process of curing the adhesive can be reliably prevented.

A method of manufacturing an electrostatic chuck according to the present invention includes the steps of: preparing a dielectric substrate on which at least one first gas hole and a communication groove which connects to at least one first opening being an end of the at least one first gas hole are formed; preparing a base plate on which at least one second gas hole and at least one second opening being an end of the at least one second gas hole are formed; preparing a solid adhesive sheet which is an insulating member; causing a surface of the dielectric substrate on which the at least one first opening is formed and a surface of the base plate on which the at least one second opening is formed to oppose each other so that the at least one first opening and the at least one second opening at mutually different positions are communicated with each other by the communication groove and sandwiching the adhesive sheet between the dielectric substrate and the base plate; and curing the adhesive sheet.

According to such a method of manufacturing an electrostatic chuck, an electrostatic chuck capable of suppressing an occurrence of a discharge via a gas hole as described above can be readily manufactured.

As yet another aspect for solving the problem described above, an electrostatic chuck according to the present invention includes: a dielectric substrate on which at least one first gas hole is formed; a base plate on which at least one second gas hole is formed; and a joining layer which is provided between the dielectric substrate and the base plate and which is formed of an insulating material. At least one first opening being an end of the at least one first gas hole is formed on a surface of the dielectric substrate on a side of the joining layer. At least one second opening being an end of the at least one second gas hole is formed at a position which differs from the at least one first opening on a surface of the base plate on a side of the joining layer. A communication path which communicates the at least one first opening and the at least one second opening with each other is formed on the joining layer.

In the electrostatic chuck configured as described above, the at least one first opening being an end of the at least one first gas hole and the at least one second opening being an end of the at least one second gas hole are at mutually different positions and the at least one first opening and the at least one second opening are communicated with each other by the communication path provided on the joining layer. The term "positions" described above refers to, for example, positions of the at least one first opening and the at least one second opening when viewed from a direction perpendicular to the joined surface.

In such a configuration, an inner surface of the at least one second gas hole is never exposed toward a side of the substrate directly under the at least one first gas hole. Since a longer creepage distance of a path from metal exposed on the inner surface of the at least one second gas hole through the at least one first gas hole to the substrate is secured as compared to conventional configurations, an occurrence of a discharge along the path can be suppressed.

In addition, in the electrostatic chuck according to the present invention, the at least one first opening includes a plurality of first openings, the at least one second opening includes a plurality of second openings, and the at least one second opening is also preferably communicated with the plurality of first openings via the communication path. In such a configuration, the number of second openings can be made smaller than the number of first openings. By reducing the number of second openings which may trigger a discharge, an occurrence of a discharge can be further suppressed.

Furthermore, in the electrostatic chuck according to the present invention, an insulator film is also preferably provided on the surface of the base plate on the side of the joining layer. In such a configuration, since a metal surface of the base plate is not exposed on an inner surface of the communication path, the occurrence of a discharge can be further suppressed.

In addition, in the electrostatic chuck according to the present invention, the insulator film is also preferably a film formed by spraying. In such a configuration, a film with high insulation properties can be readily formed and the occurrence of a discharge can be suppressed.

Furthermore, in the electrostatic chuck according to the present invention, the joining layer is also preferably a layer created by curing a solid adhesive sheet on which the communication path is formed in advance. In such a configuration, in a stage prior to joining, the communication path with a predetermined shape can be readily formed with respect to the adhesive sheet. In addition, the communication path can be reliably prevented from deforming or being blocked in the step of curing the adhesive.

A method of manufacturing an electrostatic chuck according to the present invention includes the steps of: preparing a dielectric substrate on which at least one first gas hole is formed; preparing a base plate on which at least one second gas hole is formed; preparing a solid adhesive sheet which is an insulating member and on which a communication path has been formed in advance; causing a surface of the dielectric substrate on which at least one first opening being an end of the at least one first gas hole is formed and a surface of the base plate on which at least one second opening being an end of the at least one second gas hole is formed to oppose each other and sandwiching the adhesive sheet between the dielectric substrate and the base plate so that the at least one first opening and the at least one second opening at mutually different positions are communicated with each other by the communication path; and curing the adhesive sheet.

According to such a method of manufacturing an electrostatic chuck, an electrostatic chuck capable of suppressing an occurrence of a discharge via a gas hole as described above can be readily manufactured.

According to the present invention, an electrostatic chuck capable of suppressing an occurrence of a discharge via a gas hole and a method of manufacturing the electrostatic chuck can be provided.

BRIEF DESCRIPTION OF THE DRAWINGS

FIG. 8 is a diagram for explaining a flow of gas via a communication groove in an electrostatic chuck according to a modification;

FIG. 10 is a diagram showing a configuration of a base plate included in the electrostatic chuck shown in FIG. 9;

FIG. 13 is a diagram for explaining a flow of gas via a communication groove in the electrostatic chuck shown in FIG. 9;

FIG. 17 is a sectional view schematically showing a configuration of an electrostatic chuck according to a third embodiment;

DETAILED DESCRIPTION OF THE PREFERRED EMBODIMENTS

Hereinafter, embodiments of the present invention will be described with reference to the accompanying drawings. In order to facilitate understanding of the description, the same constituent elements in the respective drawings will be denoted by the same reference signs whenever possible and redundant descriptions will not be repeated.

A first embodiment will be described. An electrostatic chuck 10 according to the present embodiment attracts a substrate W to be a processing object using an electrostatic force and holds the substrate W inside semiconductor manufacturing equipment (not illustrated) such as a CVD film deposition device. For example, the substrate W is a silicon wafer. The electrostatic chuck 10 may be used in devices other than semiconductor manufacturing equipment.

Figure 1:
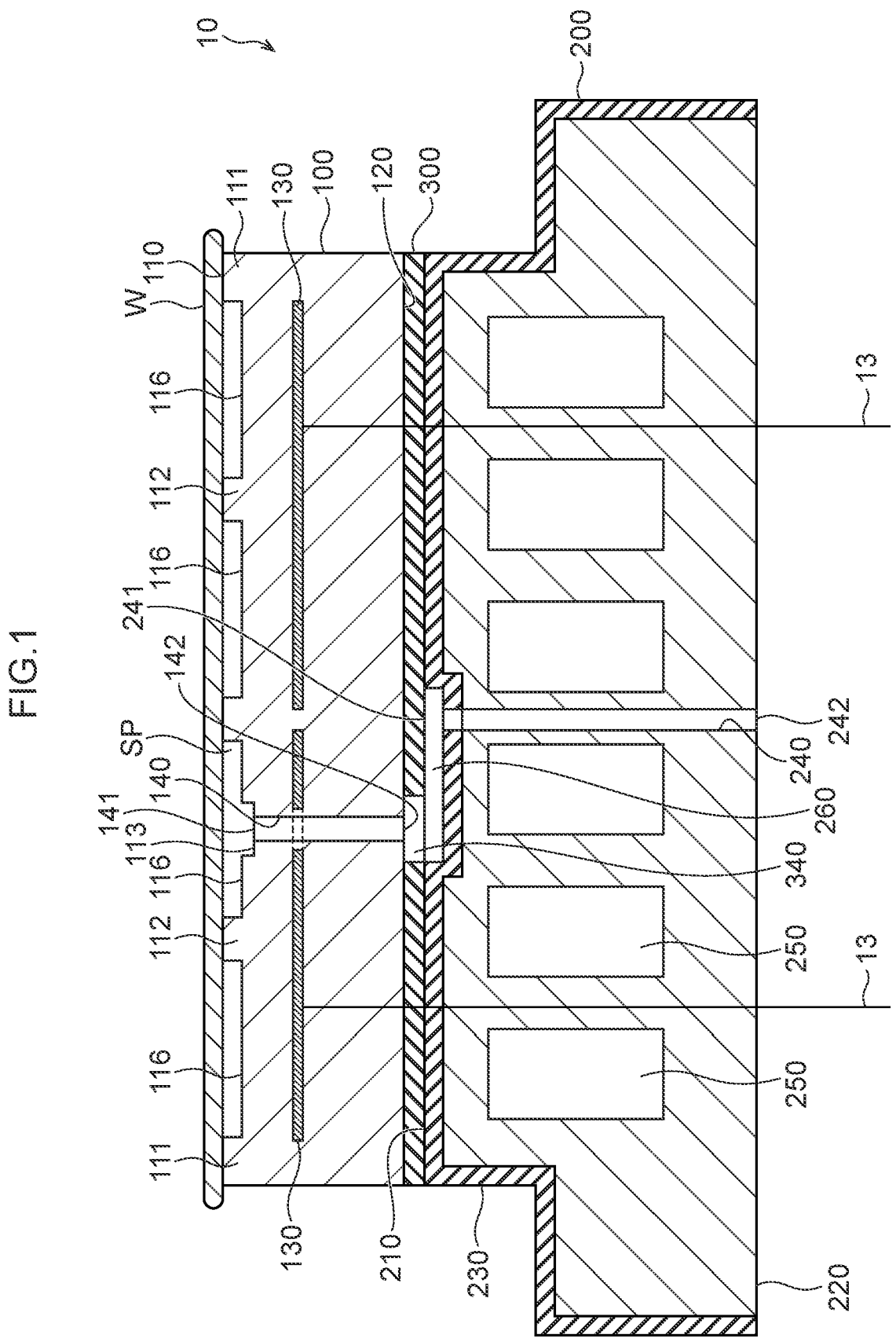
FIG. 1 is a sectional view schematically showing a configuration of an electrostatic chuck according to a first embodiment.

FIG. 1 shows a configuration of the electrostatic chuck 10 in a state where the substrate W has been attracted and is shown in a schematic sectional view. The electrostatic chuck 10 includes a dielectric substrate 100, a base plate 200, and a joining layer 300.

The dielectric substrate 100 is an approximately disk-shaped member made of a ceramic sintered compact. While the dielectric substrate 100 includes, for example, high-grade aluminum oxide ($Al_2O_3$), the dielectric substrate 100 may include other materials. A purity, a type, an additive, and the like of ceramics in the dielectric substrate 100 can be appropriately set in consideration of plasma resistance and the like which are required of the dielectric substrate 100 in the semiconductor manufacturing equipment.

An upper-side surface 110 in FIG. 1 of the dielectric substrate 100 is an "attraction surface" on which the substrate W is placed. In addition, a lower-side surface 120 in FIG. 1 of the dielectric substrate 100 is a "joined surface" to be joined to the base plate 200 via the joining layer 300 to be described later. Hereinafter, a point of view when viewing the electrostatic chuck 10 from a side of the surface 110 along a direction perpendicular to the surface 110 will also be notated as a "top view".

An attracting electrode 130 is embedded in the dielectric substrate 100. The attracting electrode 130 is a thin plate-like layer formed of a metal material such as tungsten. When voltage is applied to the attracting electrode 130 from outside via a power feed path 13, an electrostatic force is created between the surface 110 and the substrate W and, accordingly, the substrate W is attracted and held. While two attracting electrodes 130 may be provided as so-called "bipolar" electrodes, alternatively, only one may be provided as a so-called "monopolar" electrode.

In FIG. 1, an entirety of the power feed path 13 is drawn in a simplified manner. Within the power feed path 13, a portion inside the dielectric substrate 100 is configured as, for example, an elongated via (hole) filled with a conductive material and an electrode terminal (not illustrated) is provided at a lower end thereof. A portion of the power feed path 13 which penetrates the base plate 200 is a rod-like metal (busbar) of which one end is connected to the electrode terminal described above. A through hole 213 (not illustrated in FIG. 1, refer to FIG. 3) for inserting the metal is formed in the base plate 200.

As shown in FIG. 1, a space SP is formed between the dielectric substrate 100 and the substrate W. When film deposition processing is performed in the semiconductor manufacturing equipment, helium gas for temperature regulation is supplied to the space SP from outside via a gas hole 140 to be described later or the like. By interposing the helium gas between the dielectric substrate 100 and the substrate W, thermal resistance between the dielectric substrate 100 and the substrate W is regulated and, accordingly, the substrate W is kept at an appropriate temperature. Note that the gas for temperature regulation which is supplied to the space SP may be a gas other than helium.

Figure 2:
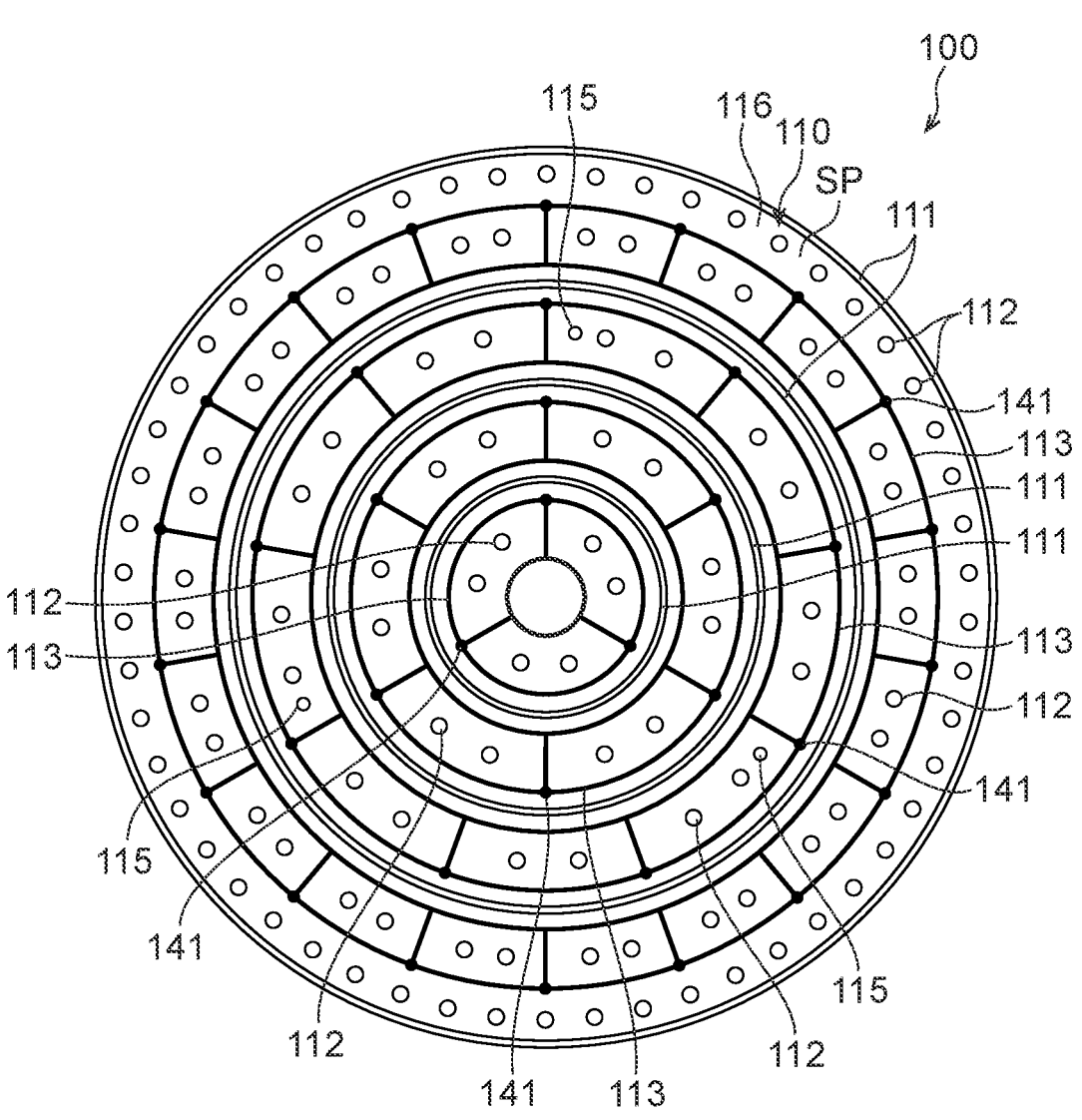
FIG. 2 is a diagram showing a configuration of a dielectric substrate included in the electrostatic chuck shown in FIG. 1.

FIG. 2 is a diagram in which the dielectric substrate 100 is drawn in a top view. As shown in FIG. 2, a seal ring 111 and a dot 112 are provided on the surface 110 being an attraction surface and the space SP is formed around the seal ring 111 and the dot 112.

The seal ring 111 is a wall which partitions the space SP and the seal ring 111 is provided in plurality so as to be concentrically aligned in a top view. An upper end of each seal ring 111 constitutes a part of the surface 110 and abuts the substrate W. In the present embodiment, four seal rings 111 are provided and, accordingly, the space SP is divided into four parts. Adopting such a configuration enables pressure of helium gas in each space SP to be individually regulated and enables a surface temperature distribution of the substrate W during processing to be made nearly uniform.

In FIG. 1 and the like, portions denoted by a reference sign "116" are a bottom surface of the space SP. Hereinafter, the portions will also be referred to as the "bottom surface 116". The seal rings 111 are formed together with the dot 112 to be described next as a result of thinning parts of the surface 110 down to a position of the bottom surface 116.

The dot 112 is a circular projection that protrudes from the bottom surface 116. As shown in FIG. 2, the dot 112 is provided in plurality and arranged so as to be approximately uniformly distributed over the attraction surface of the dielectric substrate 100. An upper end of each dot 112 constitutes a part of the surface 110 and abuts the substrate W. Providing the dot 112 described above in plurality suppresses deflection of the substrate W.

A groove 113 and an opening 141 are formed on the bottom surface 116 of each space SP. The groove 113 is a groove formed to cause the bottom surface 116 to further retreat towards the side of the surface 120. The groove 113 is formed in order to quickly diffuse the helium gas supplied from the opening 141 to be described next into the space SP and to make a pressure distribution in the space SP approximately uniform in a short period of time.

The opening 141 is an opening provided as an outlet of the helium gas supplied in the space SP. As shown in FIG. 1, the gas hole 140 is formed in the dielectric substrate 100 so as to perpendicularly penetrate the dielectric substrate 100 from the surface 110 towards the surface 120. The gas hole 140 is formed in plurality in each space SP and one end of each gas hole 140 constitutes the opening 141 described above. Another end of each gas hole 140 constitutes an opening 142 formed on the surface 120 of the dielectric substrate 100. While each opening 141 may be formed as a single opening as in the present embodiment, alternatively, the opening 141 may be formed as an assembly of a plurality of small openings.

The gas hole 140 corresponds to the "first gas hole" according to the present embodiment. The opening 142 formed on the surface 120 of the gas hole 140 corresponds to the "first opening" according to the present embodiment.

As shown in FIG. 2, in the present embodiment, all of the openings 141 are formed at positions overlapping with the groove 113 in a top view. While a diameter of the openings 141 is drawn larger than a width of the groove 113 in FIG. 2 for convenience of illustration, as shown in FIG. 1, the diameter of the actual openings 141 is smaller than the width of the groove 113. The width of the groove 113 may be locally increased at positions of the openings 141 to ensure that the openings 141 fit inside the groove 113.

In FIG. 2, reference sign "115" denotes a hole into which a lift pin (not illustrated) provided in the semiconductor manufacturing equipment is to be inserted. Hereinafter, the hole will also be referred to as a "lift pin hole 115". A total of three lift pin holes 115 are formed and arranged so as to be equally spaced at 120-degree intervals. Due to the lift pins that move up and down through the lift pin holes 115, the substrate W is attached to and detached from the surface 110 of the dielectric substrate 100.

Let us return to FIG. 1 to continue the description of the first embodiment. The base plate 200 is an approximately disk-shaped member which supports the dielectric substrate 100. For example, the base plate 200 is formed of a metal such as aluminum. An upper-side surface 210 in FIG. 1 of the base plate 200 is a "joined surface" to be joined to the dielectric substrate 100 via the joining layer 300.

An insulator film 230 is formed on approximately the entire surface of the base plate 200 excluding a lower-side surface 220 in FIG. 1. The insulator film 230 is, for example, a film made of an insulating material such as alumina and is formed by, for example, spraying. An entirety of the surface 210 described earlier constitutes an upper surface of the insulator film 230. Therefore, on the surface 210, a metal that constitutes the base plate 200 is completely unexposed to the side of the joining layer 300 with the exception of portions where an opening 241 and the like to be described later are formed. Note that a range where the insulator film 230 is formed on the base plate 200 may differ from a range according to the example shown in FIG. 1. For example, the insulator film 230 may only be formed in a range of the surface 210 (including an inner surface of communication grooves 260 to be described later) which is a joined surface.

A refrigerant flow path 250 for supplying a refrigerant is formed inside the base plate 200. When performing film deposition processing in the semiconductor manufacturing equipment, the refrigerant is supplied to the refrigerant flow path 250 from the outside and the base plate 200 is cooled by the refrigerant. Heat generated on the substrate W during the film deposition processing is transferred to the refrigerant via the helium gas in the space SP, the dielectric substrate 100, and the base plate 200 and discharged to the outside together with the refrigerant.

As shown in FIG. 1, a gas hole 240 which perpendicularly extends from the surface 210 towards the surface 220 is formed in the base plate 200. While the gas hole 240 may be formed so that the entire gas hole 240 extends linearly as in the present embodiment, alternatively, the gas hole 240 may be formed so as to bend before reaching the surface 220.

The gas hole 240 is formed in plurality in the base plate 200. An end of each gas hole 240 on the side of the surface 210 constitutes the opening 241 formed on the surface 210. An end of the gas hole 240 on the side of the surface 220 constitutes an opening 242 formed on the surface 220. The gas hole 240 corresponds to the "second gas hole" according to the present embodiment. The opening 241 formed on the surface 210 of the gas hole 240 corresponds to the "second opening" according to the present embodiment. A diameter of the gas hole 240 is expanded in a portion on the side of the surface 210. Therefore, an inner diameter of the opening 241 is slightly larger than inner diameters in other portions of the gas hole 240.

The gas hole 240 is a hole which communicates with the gas hole 140 described earlier and which constitutes a part of a path for supplying helium gas towards the space SP. However, the gas hole 240 is provided at a position that differs from the gas hole 140 in a top view. In addition, the number of gas holes 240 differs from the number of gas holes 140.

Figure 3:
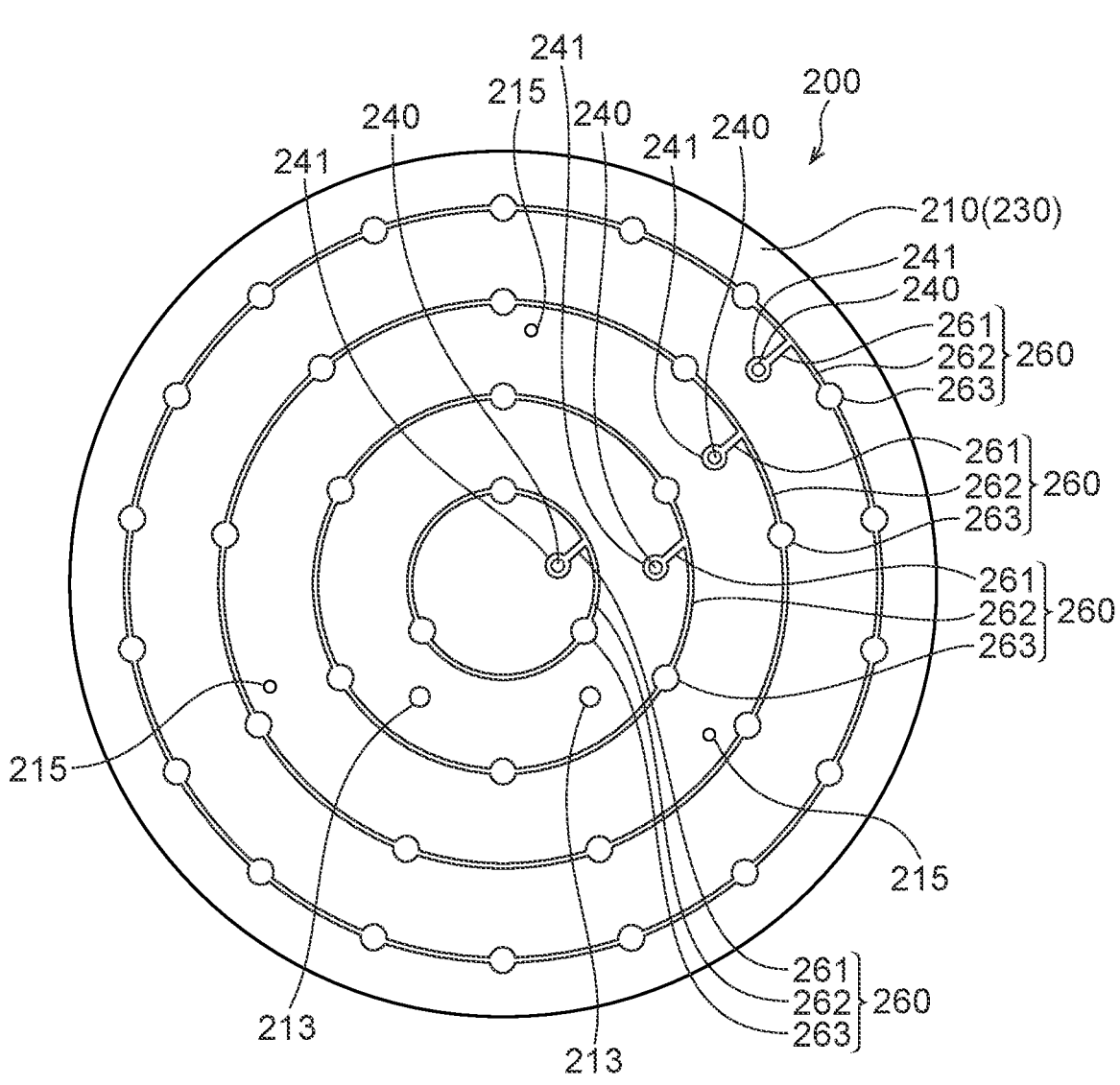
FIG. 3 is a diagram showing a configuration of a base plate included in the electrostatic chuck shown in FIG. 1.

FIG. 3 is a diagram in which only the surface 210 of the base plate 200 is drawn in a top view in a similar manner to FIG. 2. As shown in FIG. 3, in the present embodiment, a total of four gas holes 240 are formed and four openings 241 which are ends of the respective gas holes 240 are formed on the surface 210. As is obvious from a comparison between FIGS. 2 and 3, positions where the openings 241 are formed in a top view differ from positions where the openings 141 and the openings 142 of the dielectric substrate 100 are formed. As will be described later, the gas holes 140 and the gas holes 240 at mutually different positions are communicated by the communication grooves 260 provided on the base plate 200.

As shown in FIG. 3, the through hole 213 and a lift pin hole 215 are formed in the base plate 200 and ends thereof open on the surface 210.

The through hole 213 is a hole for passing the power feed path 13 as described earlier. Two through holes 213 are formed so as to correspond to the number of the attracting electrodes 130. The lift pin hole 215 is a hole into which a lift pin is to be inserted in a similar manner to the lift pin hole 115. A total of three lift pin holes 215 are provided and the lift pin holes 215 are formed at positions respectively corresponding to the lift pin holes 115 in a top view.

Let us return to FIG. 1 to continue the description of the first embodiment. The joining layer 300 is a layer provided between the dielectric substrate 100 and the base plate 200 to join the dielectric substrate 100 and the base plate 200 to each other. The joining layer 300 is created by curing an adhesive made of an insulating material. As such an adhesive, for example, a polyimide-based adhesive can be used.

Figure 4:
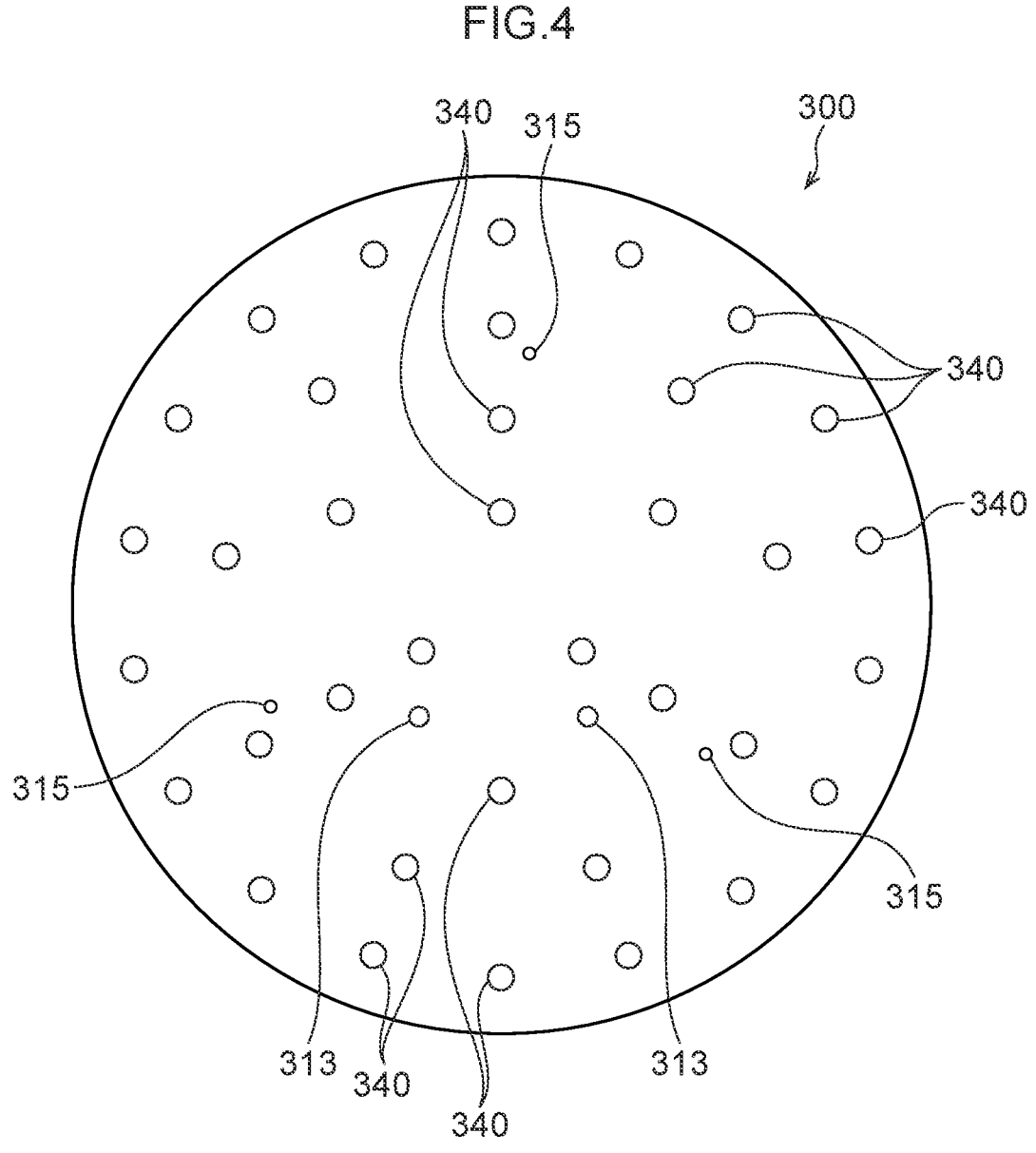
FIG. 4 is a diagram showing a configuration of a joining layer included in the electrostatic chuck shown in FIG. 1.

FIG. 4 is a diagram of only the joining layer 300 taken out from the electrostatic chuck 10 drawn as a top view in a similar manner to FIGS. 2 and 3. As shown in FIG. 4, a plurality of through holes are formed in the joining layer 300. The through holes include electrode holes 313, lift pin holes 315, and communication holes 340.

Each electrode hole 313 is a hole for passing the power feed path 13 in a similar manner to the through hole 213. A total of two electrode holes 313 are provided and the electrode holes 313 are formed at positions respectively corresponding to the through holes 213 in a top view.

Each lift pin hole 315 is a hole into which a lift pin is to be inserted in a similar manner to the lift pin hole 215. A total of three lift pin holes 315 are provided and the lift pin holes 315 are formed at positions respectively corresponding to the lift pin holes 215 in a top view.

Each communication hole 340 is a hole formed for allowing helium gas to flow towards the gas holes 140. As many communication holes 340 as the number of openings 142 are provided and the communication holes 340 are formed at positions respectively overlapping with the openings 142 in a top view. The communication holes 340 are circular holes and an inner diameter thereof is slightly larger than an inner diameter of the openings 142.

Once again referring to FIG. 3, a configuration of the communication grooves 260 will be described. As described earlier, the communication grooves 260 are grooves provided on the surface 210 in order to communicate the gas holes 140 and the gas holes 240 which are at mutually different positions with each other. Each communication groove 260 includes an outlet part 263 and connecting parts 261 and 262.

The outlet part 263 is a portion to be an outlet of helium gas having passed through the communication groove 260. As many outlet parts 263 as the number of openings 142 formed on the surface 120 of the dielectric substrate 100 are formed and the outlet parts 263 are provided at positions corresponding to the respective openings 142. In other words, the outlet parts 263 are provided at positions respectively overlapping with the openings 142 in a top view. The outlet parts 263 are approximately circular recessed parts and an inner diameter thereof is slightly larger than the inner diameter of the openings 142. The communication holes 340 described earlier are formed in the joining layer 300 in a portion between the outlet parts 263 and the openings 142.

The connecting parts 261 and 262 are grooves formed as a flow path for connecting the openings 241 and the outlet parts 263. Among the connecting parts 261 and 262, the connecting part 262 is a groove that extends in an arc along a circumferential direction so as to connect a plurality of outlet parts 263. The connecting part 261 is a groove that extends linearly from each opening 241 to the connecting part 262 on an outer circumferential side of the opening 241.

In the present embodiment, a total of four communication grooves 260 are formed and the communication grooves 260 are arranged so as to be lined up from an outer circumferential side toward an inner circumferential side in a top view. Each communication groove 260 corresponds to each of the four divided spaces SP and is provided directly under each space SP.

Figure 5:
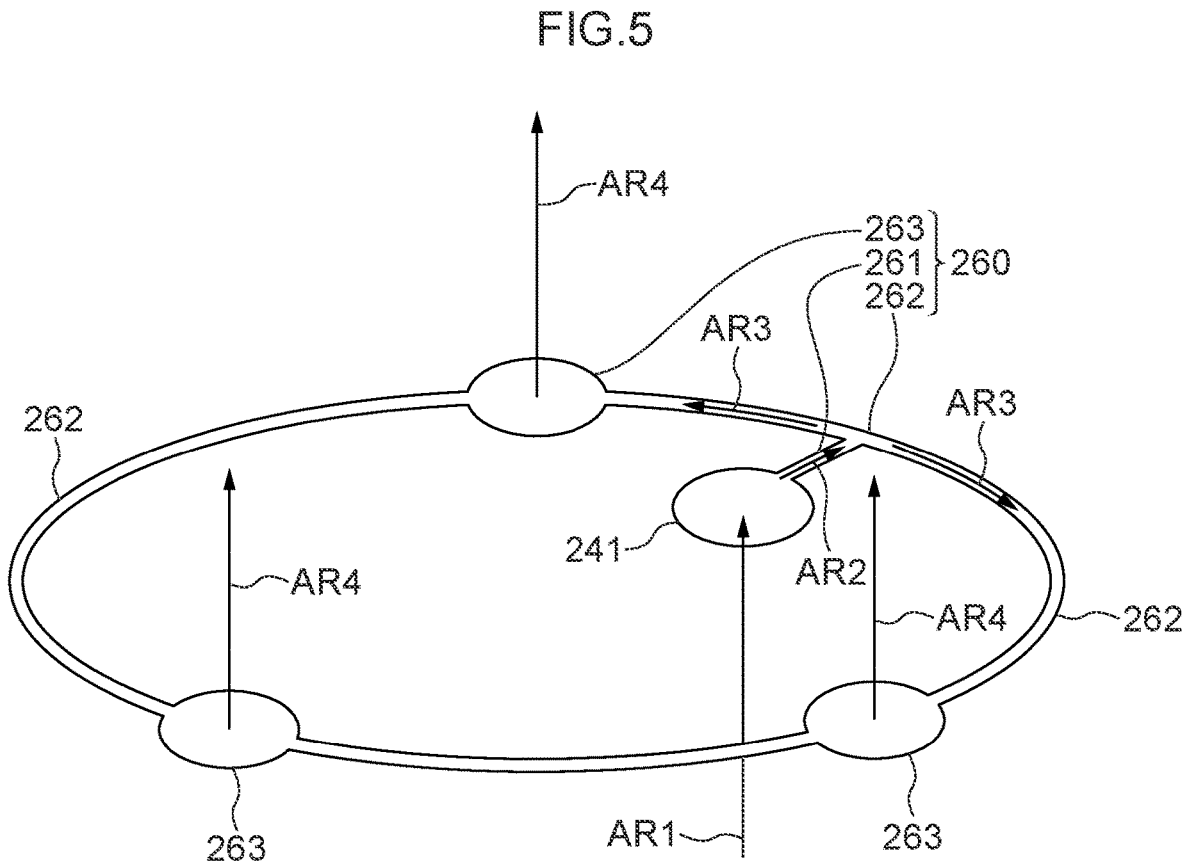
FIG. 5 is a diagram for explaining a flow of gas via a communication groove in the electrostatic chuck shown in FIG. 1.

A flow of helium gas passing through the communication groove 260 on an innermost circumferential side is schematically drawn in FIG. 5. An arrow AR1 in the diagram represents a flow of the helium gas passing through the gas hole 240 of the base plate 200. The helium gas passes through the connecting part 261 from the opening 241 and flows into the connecting part 262 (arrow AR2). Subsequently, the helium gas flows along the connecting part 262 (arrow AR3), flows into the gas hole 140 of the dielectric substrate 100 from each outlet part 263 (arrow AR4), and passes through the gas hole 140 to be supplied to the space SP. Helium gas flows in a similar manner in the other communication grooves 260.

As described above, in the electrostatic chuck 10 according to the present embodiment, after differentiating the position of the opening 142 (first opening) and the position of the opening 241 (second opening), the communication groove 260 which communicates the opening 142 and the opening 241 with each other is formed on the surface 210 of the base plate 200.

Figure 6A:
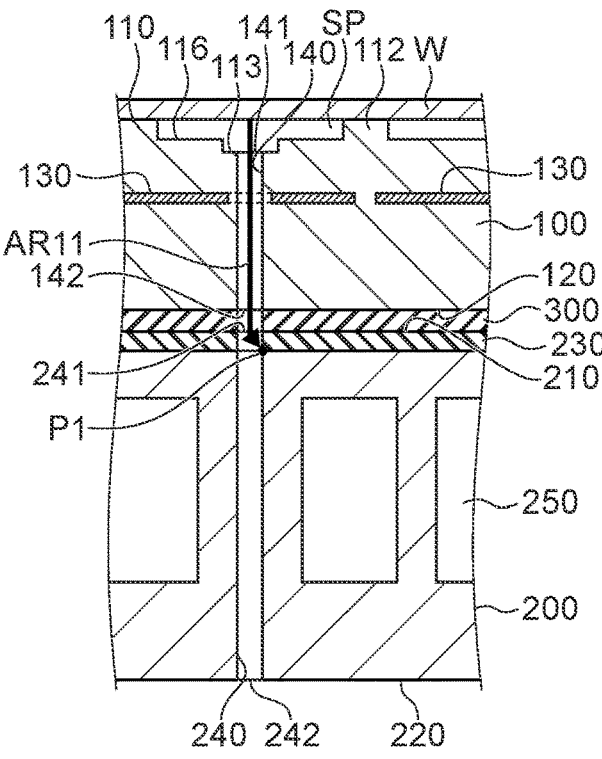
FIG. 6A is a diagram for explaining a discharge path via a gas hole.

An advantage of adopting such a configuration will be described with reference to FIG. 6A and FIG. 6B. FIG. 6A shows a configuration of an electrostatic chuck according to a comparative example. In the comparative example, the opening 142 and the opening 241 are formed at a same position or, in other words, positions that overlap with each other in a top view. A through hole which connects the opening 142 and the opening 241 to each other is formed in the joining layer 300 and the gas hole 140 and the gas hole 240 are communicated with each other through the through hole. In other words, in the present comparative example, an entirety of a flow path of helium gas constituted of the gas hole 140 and the gas hole 240 is formed so as to perpendicularly and linearly penetrate the joining layer 300.

Metal is exposed on an inner surface of the gas hole 240 provided in the base plate 200. A point P1 shown in FIG. 6A represents an uppermost portion of a metal surface exposed on the inner surface of the gas hole 240. In the configuration of the comparative example, the point P1 opposes the substrate W through a linear space. In such a configuration, since a so-called "creepage distance" is short, a discharge along an approximately linear path as indicated by an arrow AR11 relatively readily occurs.

By comparison, in the present embodiment, after differentiating the position of the opening 142 and the position of the opening 241, the communication groove 260 which communicates the opening 142 and the opening 241 with each other is formed on the surface 210 of the base plate 200 as described above. In such a configuration, as shown in FIG. 6B, an inner surface of the gas hole 240 is never exposed toward a side of the substrate W directly under the gas hole 140. A path from metal exposed on the inner surface of the gas hole 240 through the gas hole 140 and the like to the substrate W is a bent path as indicated by an arrow AR12. Since a longer creepage distance is secured as compared to the comparative example described above, an occurrence of a discharge along the path can be sufficiently suppressed.

Figure 6B:
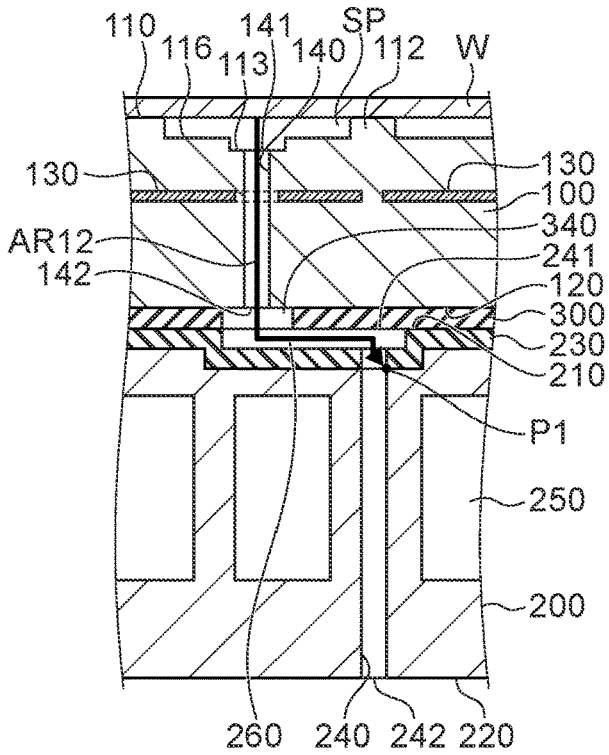
FIG. 6B is a diagram for explaining a discharge path via a gas hole.

As shown in FIG. 5 and FIGS. 6A and 6B, each communication groove 260 is formed so that one opening 241 is connected to a plurality of outlet parts 263 via connecting parts 261 and 262. As a result, in the present embodiment, one opening 241 is communicated with a plurality of the openings 142 via the communication groove 260. In such a configuration, the number of the openings 241 can be made smaller than the number of the openings 142. By reducing the number of openings 241 which may trigger a discharge, an occurrence of a discharge can be further suppressed.

Note that the number of openings 241 connected to one communication groove 260 may be two or more. In any case, the number of openings 241 connected to one communication groove 260 is preferably smaller than the number of outlet parts 263 provided in the communication groove 260.

As described earlier, the insulator film 230 is provided on the surface 210 on the side of the joining layer 300 of the base plate 200 so as to cover the entire surface 210. The insulator film 230 also covers an entire inner surface of the communication grooves 260. In such a configuration, since a metal surface of the base plate 200 is not exposed in a portion directly under the openings 142, the occurrence of a discharge can be further suppressed. While the insulator film 230 is preferably an alumina film formed by spraying as in the present embodiment, the insulator film 230 may be a film formed by other methods or a film made of other materials. For example, a range to be covered by the insulator film 230 may be only a part of the surface 210 as long as the part at least includes a portion of an inner surface of the communication grooves 260 that overlaps with the opening 142 in a top view.

Figure 7:
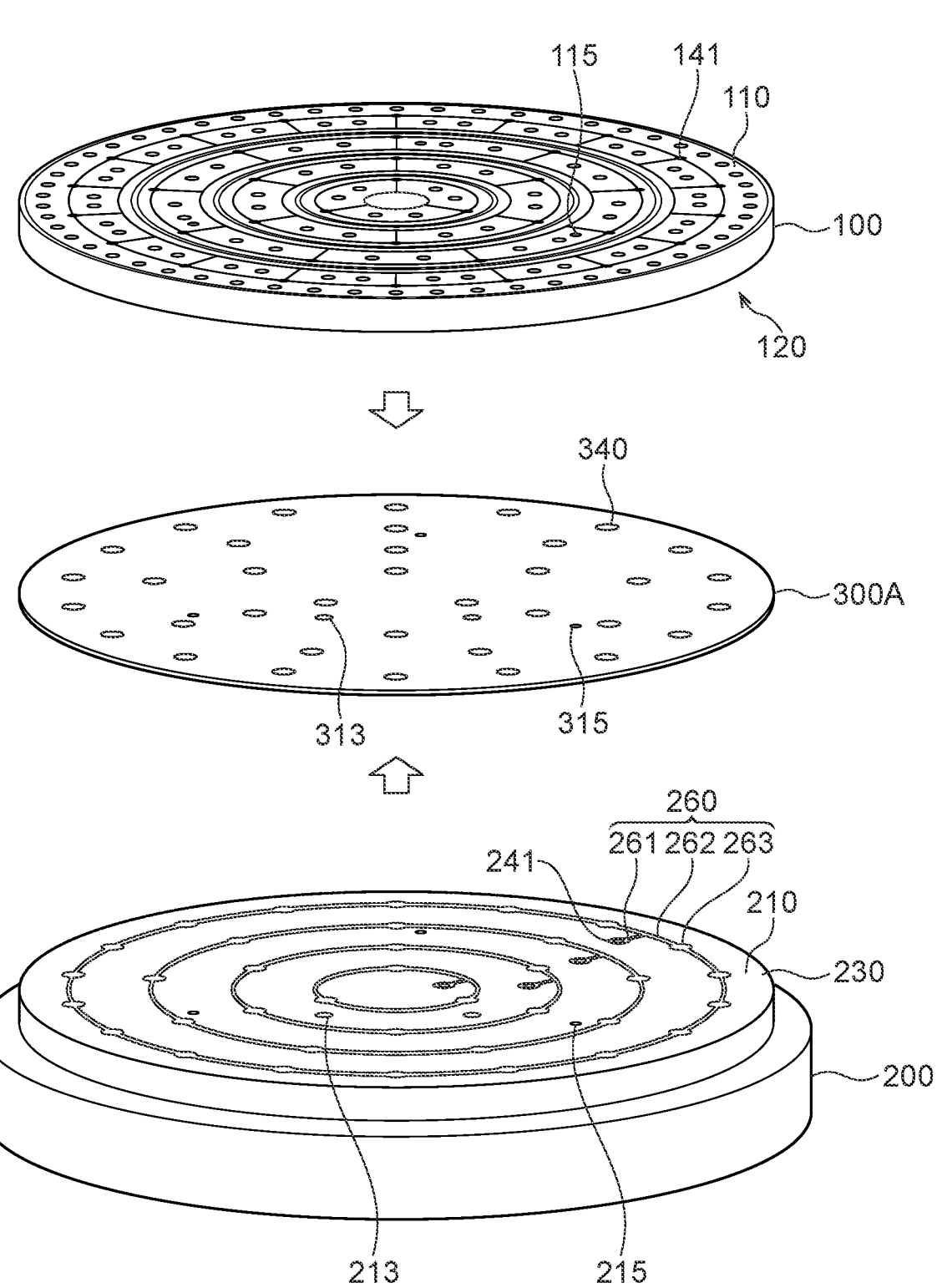
FIG. 7 is a diagram for explaining a method of manufacturing the electrostatic chuck shown in FIG. 1.

A method of manufacturing the electrostatic chuck 10 will be briefly described. First, as shown in FIG. 7, the dielectric substrate 100, the base plate 200, and an adhesive sheet 300A are respectively prepared. Subsequently, the dielectric substrate 100 and the base plate 200 are joined to each other using the adhesive sheet 300A.

The dielectric substrate 100 is in a state where the attracting electrodes 130, the gas holes 140, the openings 142, the seal rings 111, and the like have been formed in advance prior to joining. As methods of forming these elements, various known methods can be adopted.

The base plate 200 is similarly in a state where the refrigerant flow paths 250, the gas holes 240, the openings 241, and the like have been formed in advance prior to joining. As methods of forming these elements, various known methods can be adopted. In addition, the communication grooves 260 shown in FIG. 3 are also formed in advance on the base plate 200 prior to joining and the base plate 200 is in a state where the communication grooves 260 are connected to the openings 241. The insulator film 230 which covers the inner surface of the communication grooves 260 and the like is also formed in advance prior to joining.

The adhesive sheet 300A is an insulating member to become the joining layer 300 by being cured upon joining. In other words, while the adhesive sheet 300A is an "adhesive", the adhesive sheet 300A does not assume a liquid form even in a stage prior to curing and is a solid sheet-like member with flexibility. As the adhesive sheet 300A, for example, an adhesive film which is polyimide-based, epoxy-based, silicone-based, or acrylic-based can be used. As the adhesive film, a film with superior thermal conductivity or high insulation properties can be suitably used.

Since the adhesive sheet 300A has a solid sheet shape even prior to curing as described above, for example, by applying punching using a die or the like, the communication holes 340, the electrode holes 313, the lift pin holes 315, and the like can be formed in advance prior to joining.

After preparing the dielectric substrate 100, the base plate 200, and the adhesive sheet 300A described above, as shown in FIG. 7, the adhesive sheet 300A is sandwiched between the dielectric substrate 100 and the base plate 200. Specifically, the surface 120 on which the opening 142 is formed on the dielectric substrate 100 and the surface 210 on which the opening 241 is formed on the base plate 200 are arranged to oppose each other so that the opening 142 and the opening 241 at mutually different positions are communicated with each other by the communication groove 260 and the adhesive sheet 300A is sandwiched between the dielectric substrate 100 and the base plate 200.

In a state where the adhesive sheet 300A is sandwiched as described above, entireties of the dielectric substrate 100, the base plate 200, and the adhesive sheet 300A are heated up to a predetermined temperature. Due to the heating, the adhesive sheet 300A is cured in a state of being joined to both the surface 120 and the surface 210 and becomes the joining layer 300 shown in FIG. 1. The through holes such as the communication holes 340 having been formed in advance in the adhesive sheet 300A more or less retain their original shapes even after the adhesive sheet 300A is cured. Therefore, parts of the adhesive sheet 300A do not penetrate into the communication grooves 260 having been formed on the base plate 200 and the communication grooves 260 also retain their original shapes. According to the method described above, the electrostatic chuck 10 configured as shown in FIG. 1 is manufactured.

As described above, the joining layer 300 according to the present embodiment is created by curing the solid adhesive sheet 300A on which the communication holes 340 and the like have been formed in advance. Using the adhesive sheet 300A enables the communication holes 340 and the like to be readily formed in a stage prior to joining in a portion (the adhesive sheet 300A) to become the joining layer 300. In addition, the communication grooves 260 can be reliably prevented from deforming or being blocked in the step of curing the adhesive.

If penetration by an adhesive or the like into the communication grooves 260 can be prevented in some way, a liquid adhesive can be used instead of the adhesive sheet 300A as the adhesive to become the joining layer 300. For example, by performing bonding after arranging, in advance, a string-like solid material to act as a "levee" for preventing penetration by a liquid adhesive along outer peripheries of the communication grooves 260, the communication holes 340, and the like, the joining layer 300 similar to the present embodiment can be formed.

Figure 8:
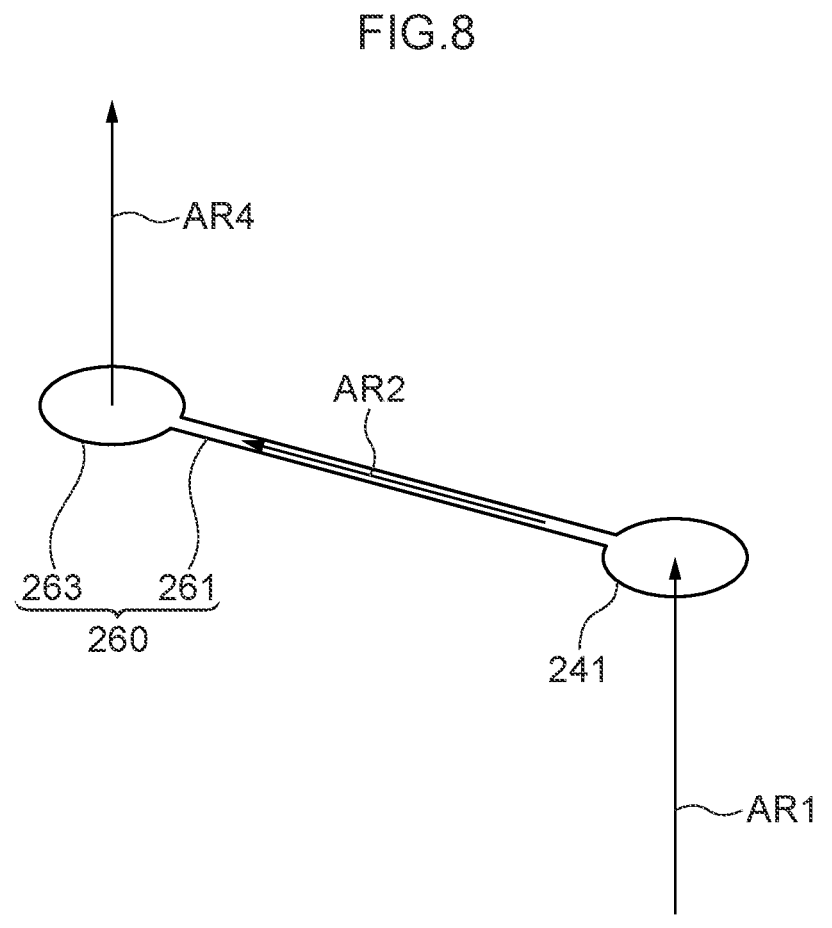

A shape of the communication grooves 260 formed on the base plate 200 can be changed as appropriate. The communication grooves 260 of the electrostatic chuck 10 according to a modification are drawn in FIG. 8 in a similar method to FIG. 5. In the present modification, the number of gas holes 140 formed in the dielectric substrate 100 and the number of gas holes 240 formed in the base plate 200 are the same. Therefore, each communication groove 260 provided on the surface 210 of the base plate 200 has one each of the connecting part 261 and the outlet part 263 and the opening 241 and the outlet part 263 are directly connected to each other by one connecting part 261. In this manner, a configuration may be adopted in which each of the openings 241 is communicated with only one opening 142 via the communication groove 260.

A second embodiment will be described. Hereinafter, differences from the first embodiment will be mainly described and descriptions of features in common with the first embodiment will be omitted when appropriate.

Figure 9:
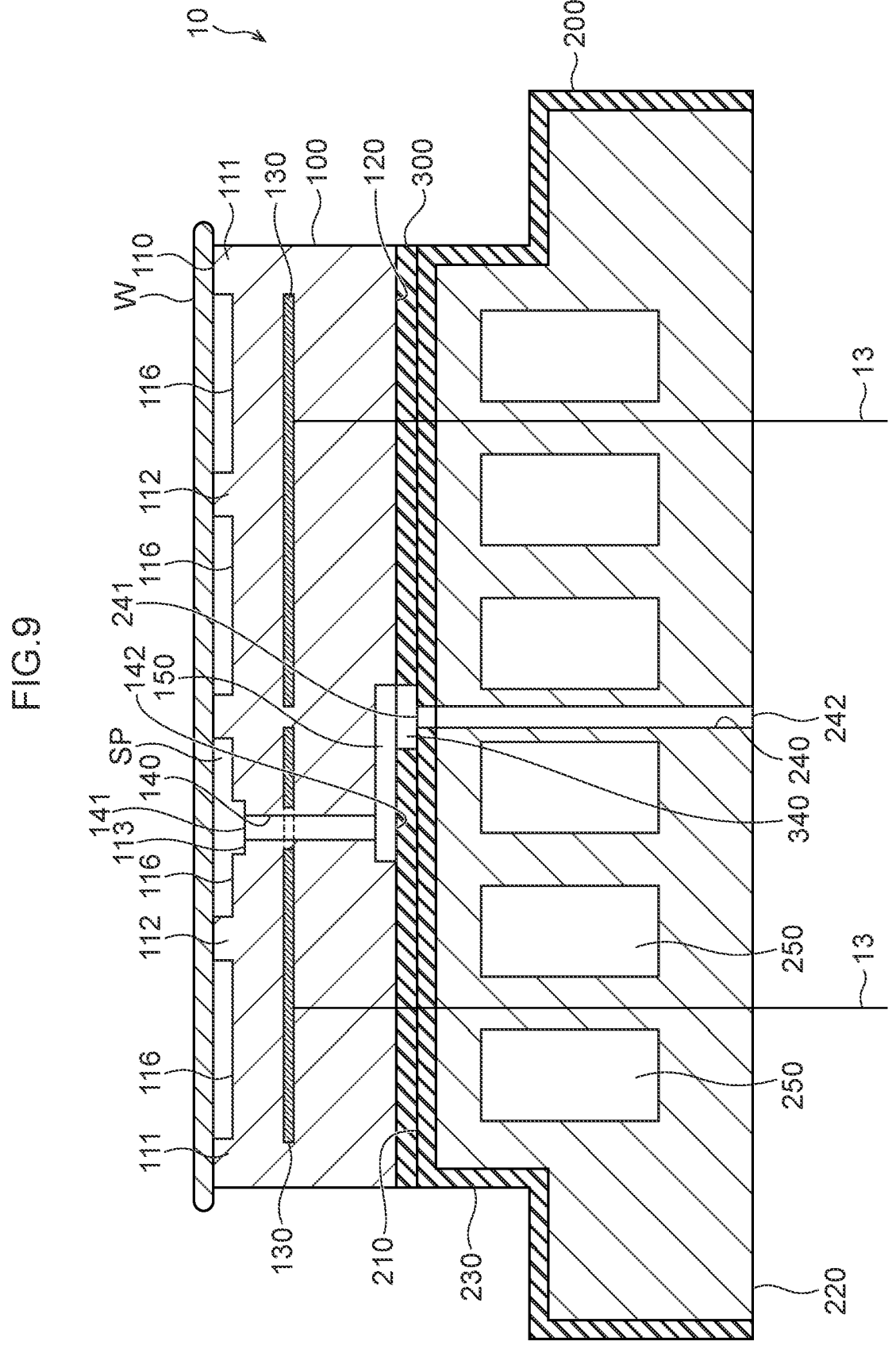
FIG. 9 is a sectional view schematically showing a configuration of an electrostatic chuck according to a second embodiment.

FIG. 9 shows a configuration of the electrostatic chuck 10 according to the present embodiment as a schematic sectional view similar to FIG. 1.

Within the power feed path 13 connected to the attracting electrode 130, a portion inside the dielectric substrate 100 is configured as, for example, an elongated via (hole) filled with a conductive material and an electrode terminal 103 (not illustrated in FIG. 9, refer to FIG. 12) is provided at a lower end thereof. A portion of the power feed path 13 which penetrates the base plate 200 is a rod-like metal (busbar) of which one end is connected to the electrode terminal 103 described above. The through hole 213 (not illustrated in FIG. 9, refer to FIG. 10) for inserting the metal is formed in the base plate 200.

The gas hole 140 corresponds to the "first gas hole" according to the present embodiment. The opening 142 formed on the surface 120 of the gas hole 140 corresponds to the "first opening" according to the present embodiment. A diameter of the gas hole 140 is expanded in a portion on the side of the surface 120. Therefore, an inner diameter of the opening 142 is slightly larger than inner diameters in other portions of the gas hole 140.

The gas hole 240 corresponds to the "second gas hole" according to the present embodiment. The opening 241 formed on the surface 210 of the gas hole 240 corresponds to the "second opening" according to the present embodiment. A diameter of the gas hole 240 according to the present embodiment is not expanded in a portion on the side of the surface 210. Therefore, an inner diameter of the opening 241 is the same as the inner diameters in other portions of the gas hole 240.

Figure 10:
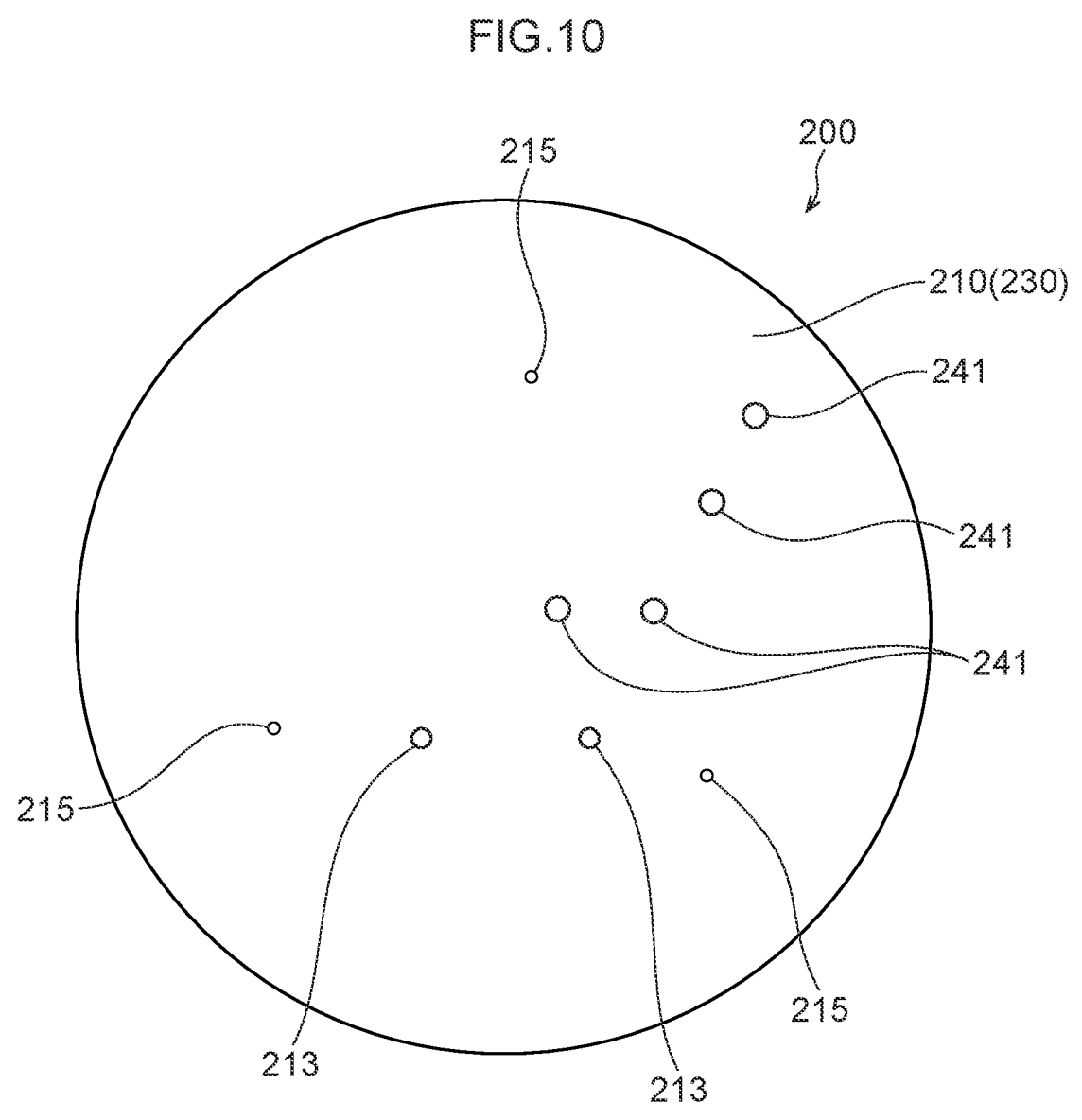

FIG. 10 is a diagram in which only the surface 210 of the base plate 200 is drawn in a top view. As shown in FIG. 10, even in the present embodiment, positions, where the openings 241 are formed in a top view, differ from positions where the openings 141 and the openings 142 of the dielectric substrate 100 are formed. As will be described later, the gas holes 140 and the gas holes 240 at mutually different positions are communicated by communication grooves 150 provided in the dielectric substrate 100.

Figure 11:
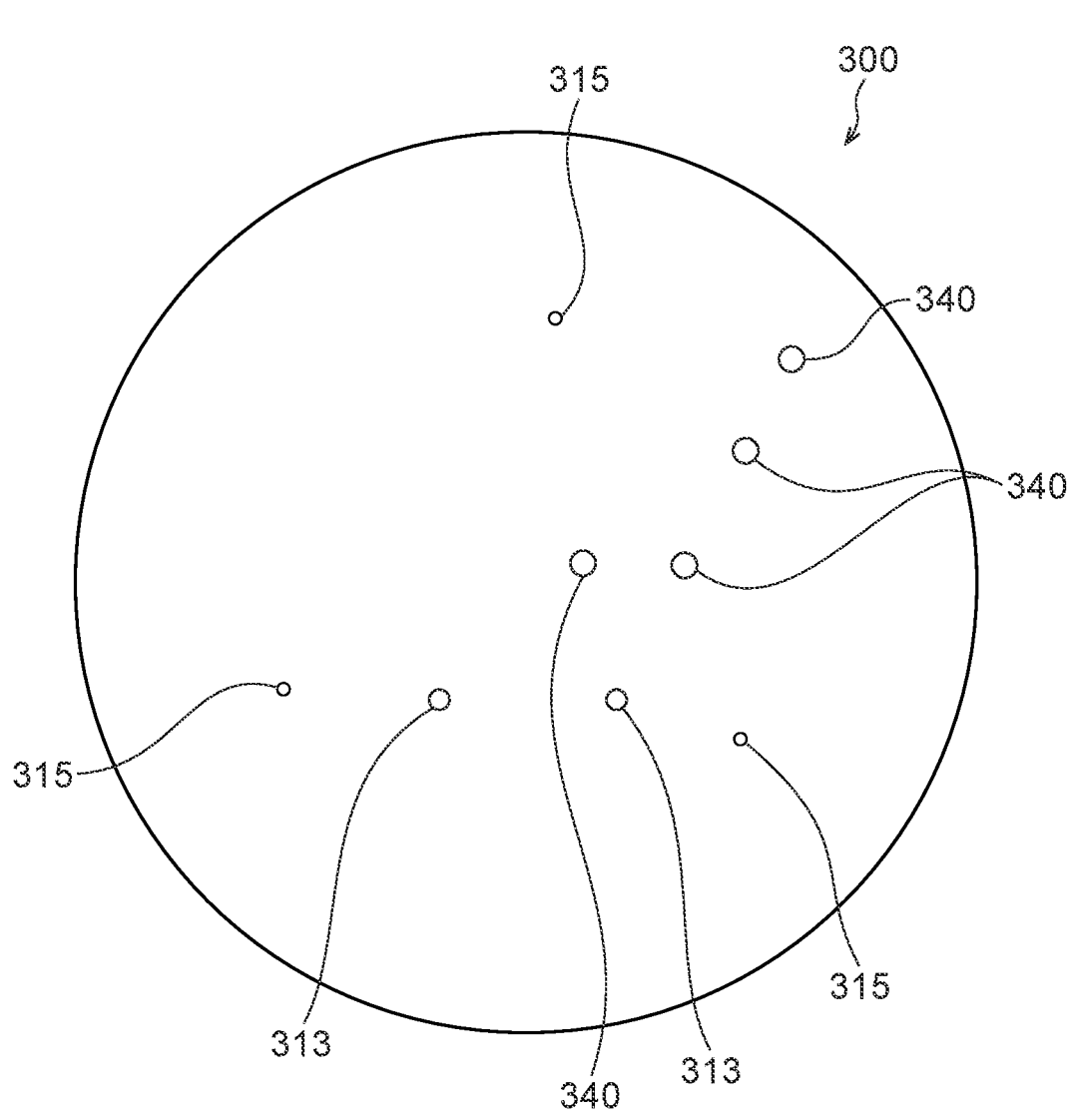
FIG. 11 is a diagram showing a configuration of a joining layer included in the electrostatic chuck shown in FIG. 9.

FIG. 11 is a diagram of only the joining layer 300 taken out from the electrostatic chuck 10 drawn as a top view.

Each communication hole 340 is a hole formed for allowing helium gas from the gas holes 240 to pass. A total of four communication holes 340 are provided and the communication holes 340 are respectively formed at positions overlapping with the openings 241 in a top view. The communication holes 340 are circular holes and an inner diameter thereof is slightly larger than an inner diameter of the openings 241.

Figure 12:
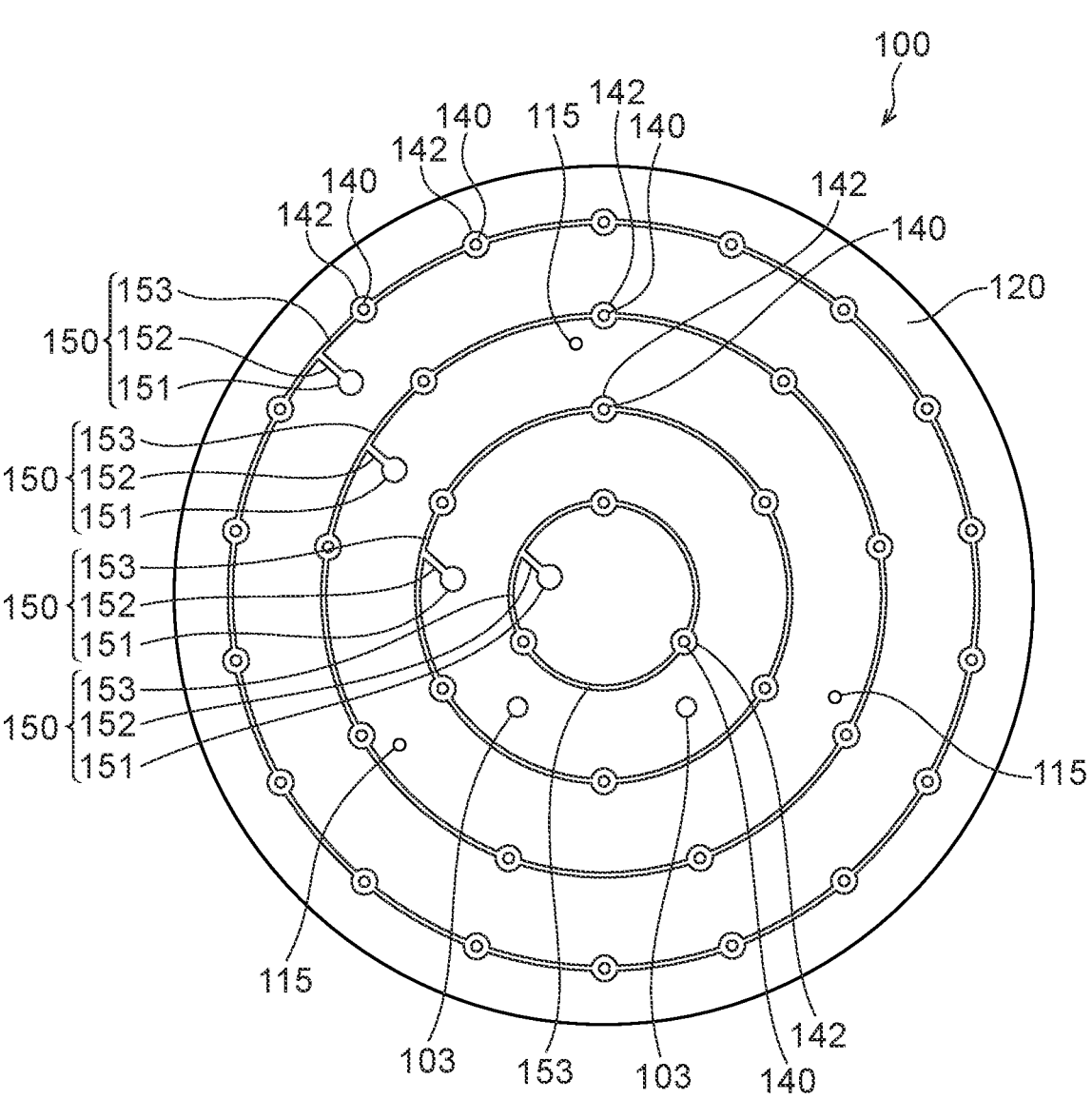
FIG. 12 is a diagram showing a configuration of a dielectric substrate included in the electrostatic chuck shown in FIG. 9.

FIG. 12 is a diagram in which the dielectric substrate 100 is drawn as viewed from the side of the surface 120. As shown in FIG. 11, communication grooves 150 are formed on the surface 120. The communication grooves 150 are grooves provided in order to communicate the gas holes 140 and the gas holes 240 which are at mutually different positions with each other. Each communication groove 150 includes an inlet part 151 and connecting parts 152 and 153.

The inlet part 151 is a portion to be an inlet when helium gas having passed through the gas hole 240 of the base plate 200 flows into the communication groove 150. As many inlet parts 151 as the number of openings 241 formed on the surface 210 of the base plate 200 are formed and the inlet parts 151 are provided at positions corresponding to the respective openings 241. In other words, the inlet parts 151 are provided at positions respectively overlapping with the openings 241 in a top view. The inlet parts 151 are approximately circular recessed parts and an inner diameter thereof is slightly larger than the inner diameter of the openings 241. The communication hole 340 described earlier is formed in the joining layer 300 in a portion between the inlet parts 151 and the openings 241.

The connecting parts 152 and 153 are grooves formed as a flow path for connecting the inlet part 151 and the openings 142. Among the connecting parts 152 and 153, the connecting part 153 is a groove that extends in an arc along a circumferential direction so as to connect a plurality of openings 142. The connecting part 152 is a groove that extends linearly from the inlet part 151 to the connecting part 153 on an outer circumferential side of the inlet part 151.

In the present embodiment, a total of four communication grooves 150 are formed and the communication grooves 150 are arranged so as to be lined up from an outer circumferential side toward an inner circumferential side in a top view. Each communication groove 150 corresponds to each of the four divided spaces SP and is provided directly under each space SP.

Figure 13:
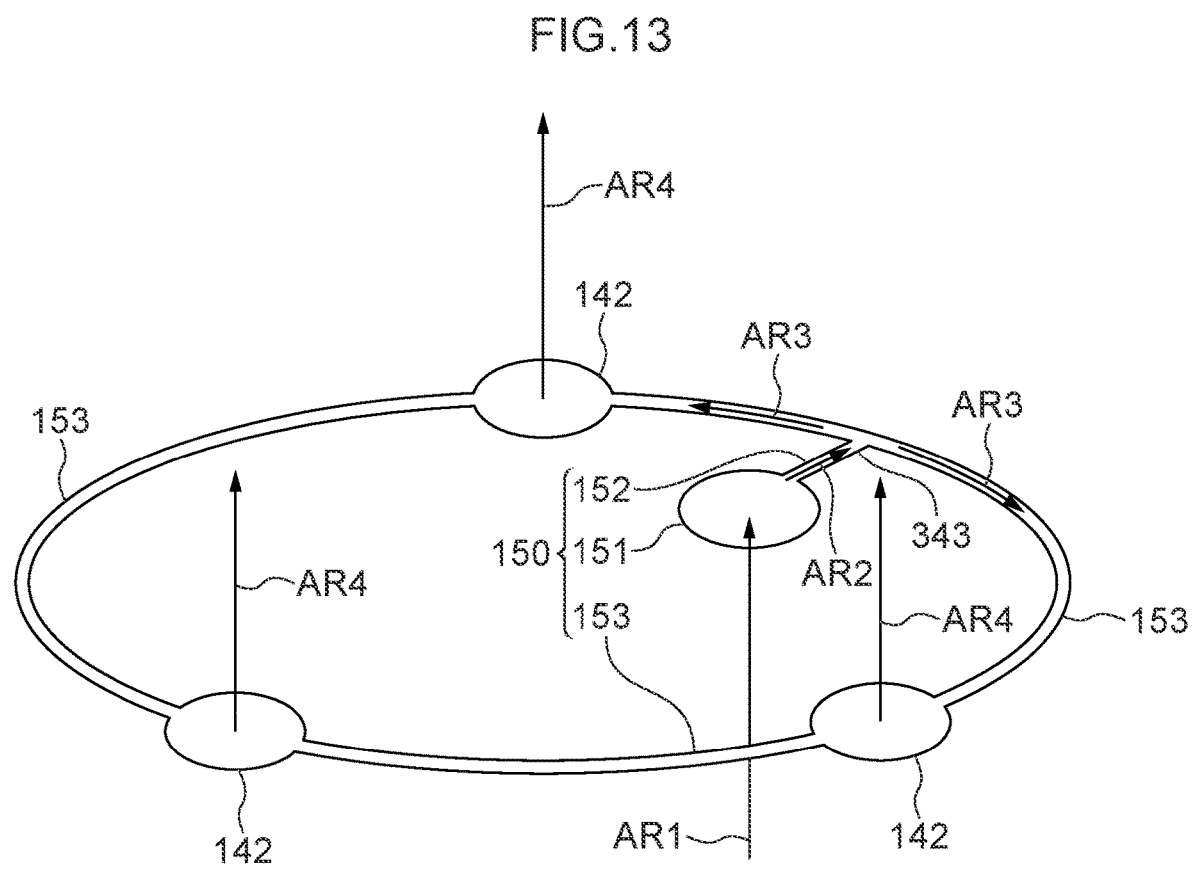

A flow of helium gas passing through the communication groove 150 on an innermost circumferential side is schematically drawn in FIG. 13. An arrow AR1 in the diagram represents a flow of the helium gas passing through the gas hole 240 of the base plate 200. After flowing into the communication groove 150 from the inlet part 151, the helium gas passes through the connecting part 152 and flows into the connecting part 153 (arrow AR2). Subsequently, the helium gas flows along the connecting part 153 (arrow AR3), flows into each opening 142 of the dielectric substrate 100, and passes through the gas hole 140 to be supplied to the space SP (arrow AR4). Helium gas flows in a similar manner in the other communication grooves 150.

As described above, in the electrostatic chuck 10 according to the present embodiment, after differentiating the position of the opening 142 (first opening) and the position of the opening 241 (second opening), the communication groove 150 which communicates the opening 142 and the opening 241 with each other is formed on the surface 120 of the dielectric substrate 100.

Figure 14A:
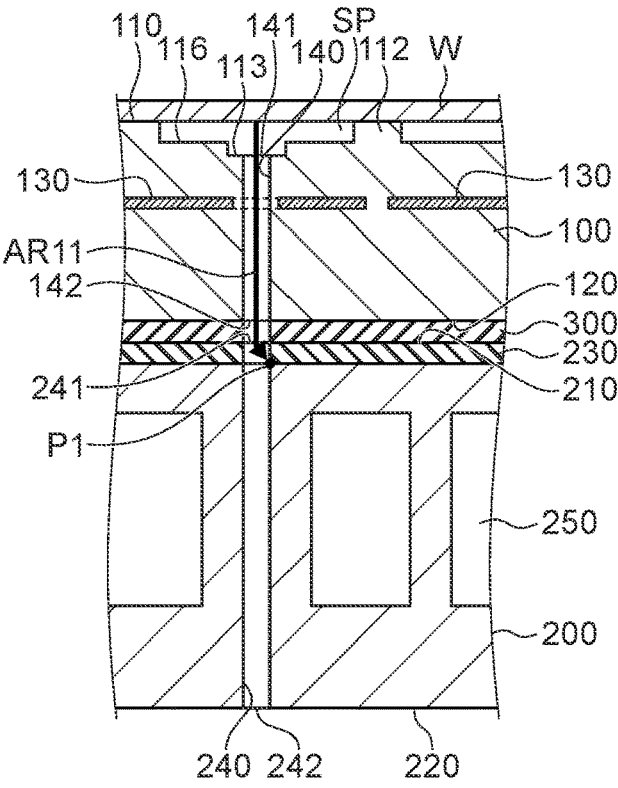
FIG. 14A is a diagram for explaining a discharge path via a gas hole.
Figure 14B:
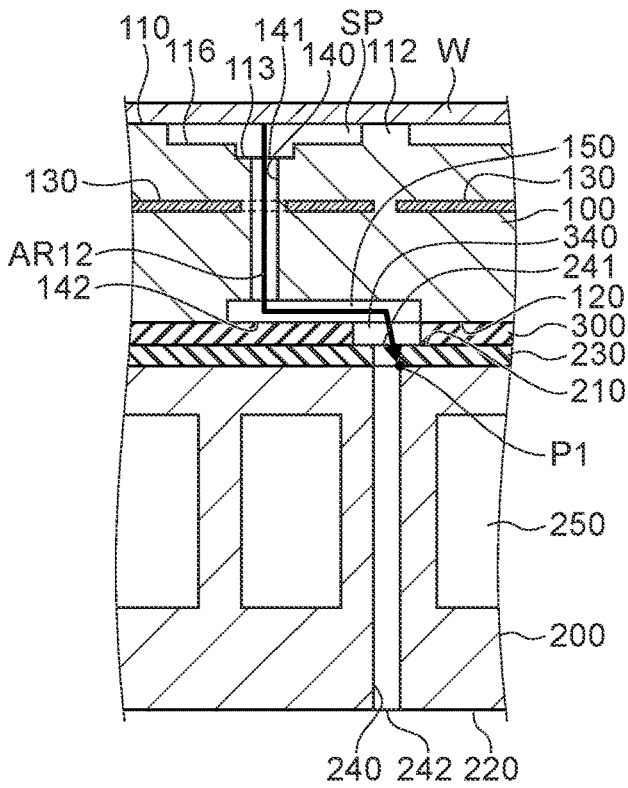
FIG. 14B is a diagram for explaining a discharge path via a gas hole.

An advantage of adopting such a configuration will be described with reference to FIG. 14A and FIG. 14B. FIG. 14A shows a configuration of an electrostatic chuck according to a comparative example. The configuration of the comparative example shown in FIG. 14A is the same as the configuration of the comparative example shown in FIG. 6A. As described earlier, in the present comparative example, since a so-called "creepage distance" is short, a discharge along an approximately linear path as indicated by an arrow AR11 relatively readily occurs.

By comparison, in the present embodiment, after differentiating the position of the opening 142 and the position of the opening 241, the communication groove 150 which communicates the opening 142 and the opening 241 with each other is formed on the surface 120 of the dielectric substrate 100 as described above. In such a configuration, as shown in FIG. 14B, an inner surface of the gas hole 240 is never exposed toward a side of the substrate W directly under the gas hole 140. A path from metal exposed on the inner surface of the gas hole 240 through the gas hole 140 and the like to the substrate W is a bent path as indicated by an arrow AR12. Since a longer creepage distance is secured as compared to the comparative example described above, an occurrence of a discharge along the path can be sufficiently suppressed.

As shown in FIGS. 12 and 13, each communication groove 150 is formed so that one inlet part 151 is connected to a plurality of openings 142 via connecting parts 152 and 153. As a result, in the present embodiment, one opening 241 is communicated with a plurality of the openings 142 via the communication groove 150. In such a configuration, the number of the openings 241 can be made smaller than the number of the openings 142. By reducing the number of openings 241 which may trigger a discharge, an occurrence of a discharge can be further suppressed.

Note that the number of inlet parts 151 provided in one communication groove 150 may be two or more. In any case, the number of inlet parts 151 provided in one communication groove 150 is preferably smaller than the number of openings 142 connected to the communication groove 150.

As described earlier, the insulator film 230 is provided on the surface 210 on the side of the joining layer 300 of the base plate 200 so as to cover the entire surface 210. In such a configuration, since the surface of the base plate 200 becomes covered by both the joining layer 300 and the insulator film 230, an occurrence of a discharge can be sufficiently suppressed. While the insulator film 230 is preferably an alumina film formed by spraying as in the present embodiment, the insulator film 230 may be a film formed by other methods or a film made of other materials. When insulation properties can be sufficiently secured solely by the joining layer 300, the insulator film 230 need not be formed on the base plate 200.

Figure 15:
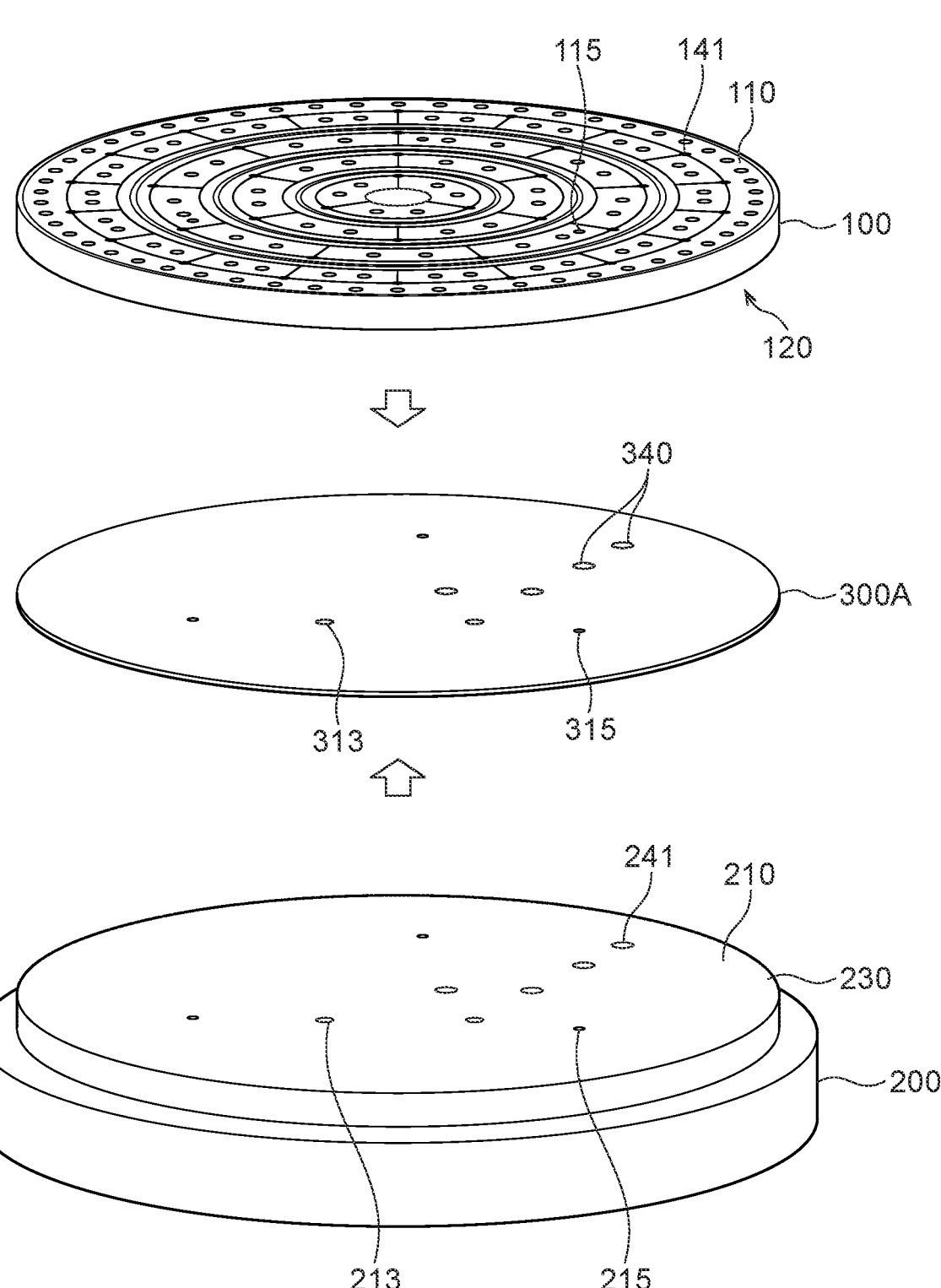
FIG. 15 is a diagram for explaining a method of manufacturing the electrostatic chuck shown in FIG. 9.

A method of manufacturing the electrostatic chuck 10 will be briefly described. First, as shown in FIG. 15, the dielectric substrate 100, the base plate 200, and the adhesive sheet 300A are respectively prepared. Subsequently, the dielectric substrate 100 and the base plate 200 are joined to each other using the adhesive sheet 300A.

The dielectric substrate 100 is in a state where the attracting electrodes 130, the gas holes 140, the openings 142, the seal rings 111, and the like have been formed in advance prior to joining. As methods of forming these elements, various known methods can be adopted. In addition, the communication grooves 150 shown in FIG. 12 are also formed in advance on the dielectric substrate 100 prior to joining and the dielectric substrate 100 is in a state where the communication grooves 150 are connected to the openings 142.

The base plate 200 is also in a state where the refrigerant flow paths 250, the gas holes 240, the openings 241, the insulator film 230, and the like have been formed in advance prior to joining. As methods of forming these elements, various known methods can be adopted.

The adhesive sheet 300A is an insulating member to become the joining layer 300 by being cured upon joining. As the adhesive sheet 300A, the same adhesive sheet as in the first embodiment can be used. However, the present embodiment differs from the first embodiment in that only four communication holes 340 are formed in the adhesive sheet 300A.

After preparing the dielectric substrate 100, the base plate 200, and the adhesive sheet 300A as described above, as shown in FIG. 15, the adhesive sheet 300A is sandwiched between the dielectric substrate 100 and the base plate 200. Specifically, the surface 120 on which the opening 142 is formed of the dielectric substrate 100 and the surface 210 on which the opening 241 is formed of the base plate 200 are arranged to oppose each other so that the opening 142 and the opening 241 at mutually different positions are communicated with each other by the communication groove 150 and the adhesive sheet 300A is sandwiched between the dielectric substrate 100 and the base plate 200.

In a state where the adhesive sheet 300A is sandwiched as described above, entireties of the dielectric substrate 100, the base plate 200, and the adhesive sheet 300A are heated up to a predetermined temperature. Due to the heating, the adhesive sheet 300A is cured in a state of being joined to both the surface 120 and the surface 210 and becomes the joining layer 300 shown in FIG. 9. The through holes such as the communication holes 340 having been formed in advance in the adhesive sheet 300A more or less retain their original shapes even after the adhesive sheet 300A is cured. Therefore, parts of the adhesive sheet 300A do not penetrate into the communication grooves 150 having been formed on the dielectric substrate 100 and the communication grooves 150 also retain their original shapes. According to the method described above, the electrostatic chuck 10 configured as shown in FIG. 9 is manufactured.

As described above, the joining layer 300 according to the present embodiment is created by curing the solid adhesive sheet 300A on which the communication holes 340 and the like have been formed in advance. Using the adhesive sheet 300A enables the communication holes 340 and the like to be readily formed in a stage prior to joining in a portion (the adhesive sheet 300A) to become the joining layer 300. In addition, the communication grooves 150 can be reliably prevented from deforming or being blocked in the step of curing the adhesive.

If the penetration by an adhesive or the like into the communication grooves 150 can be prevented in some way, a liquid adhesive can be used instead of the adhesive sheet 300A as the adhesive to become the joining layer 300. For example, by performing bonding after arranging, in advance, a string-like solid material to act as a "levee" for preventing penetration by a liquid adhesive along outer peripheries of the communication grooves 150, the communication holes 340, and the like, the joining layer 300 similar to the present embodiment can be formed.

Figure 16:
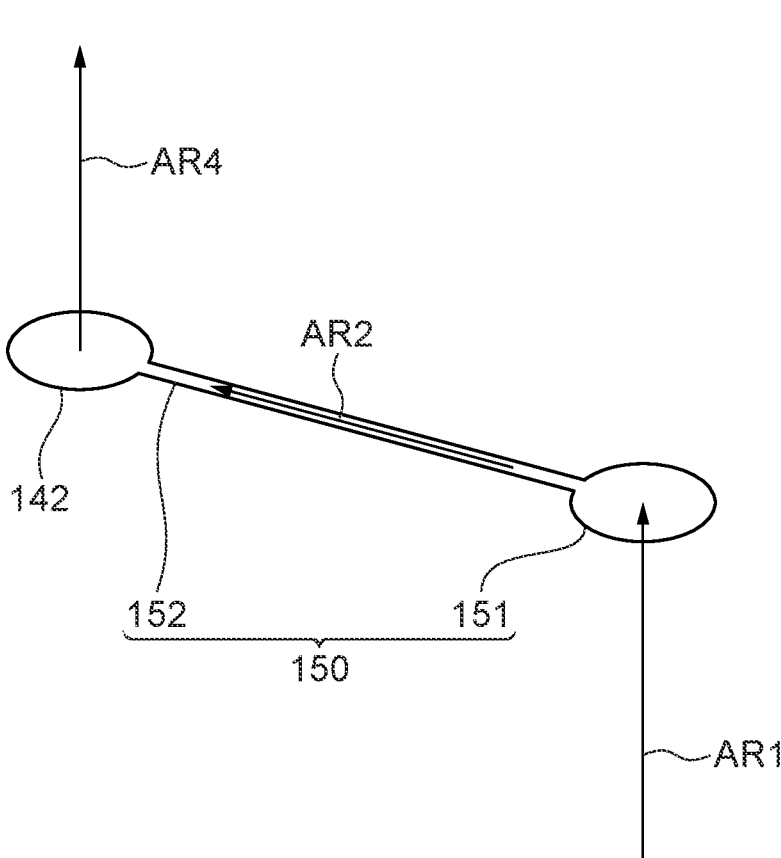
FIG. 16 is a diagram for explaining a flow of gas via a communication groove in an electrostatic chuck according to a modification.

A shape of the communication grooves 150 formed on the dielectric substrate 100 can be changed as appropriate. The communication grooves 150 of the electrostatic chuck 10 according to a modification are drawn in FIG. 16 in a similar method to FIG. 13. In the present modification, the number of gas holes 140 formed in the dielectric substrate 100 and the number of gas holes 240 formed in the base plate 200 are the same. Therefore, each communication groove 150 provided on the surface 120 of the dielectric substrate 100 has one each of the inlet part 151 and the connecting part 152 and the inlet part 151 and the opening 142 are directly connected to each other by one connecting part 152. In this manner, a configuration may be adopted in which each of the openings 241 is communicated with only one opening 142 via the communication groove 150.

A third embodiment will be described. Hereinafter, differences from the first embodiment will be mainly described and descriptions of features in common with the first embodiment will be omitted when appropriate.

Figure 17:
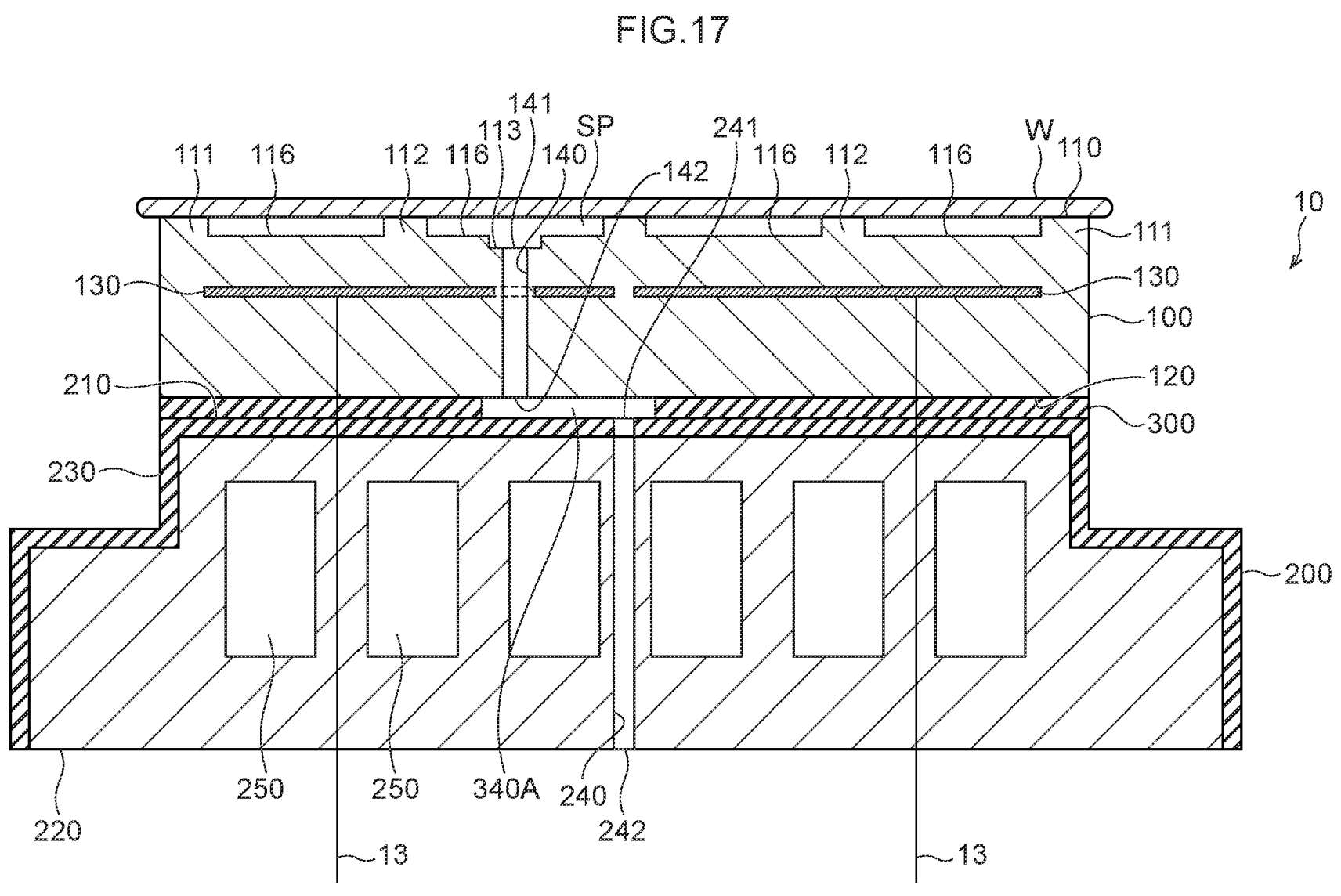

FIG. 17 shows a configuration of the electrostatic chuck 10 according to the present embodiment as a schematic sectional view similar to FIG. 1.

The gas hole 140 corresponds to the "first gas hole" according to the present embodiment. The opening 142 formed on the surface 120 of the gas hole 140 corresponds to the "first opening" according to the present embodiment. The gas hole 240 corresponds to the "second gas hole" according to the present embodiment. The opening 241 formed on the surface 210 of the gas hole 240 corresponds to the "second opening" according to the present embodiment. A diameter of the gas hole 240 according to the present embodiment is not expanded in a portion on the side of the surface 210. Therefore, an inner diameter of the opening 241 is the same as the inner diameters in other portions of the gas hole 240.

A configuration of the surface 210 of the base plate 200 in a top view is the same as the configuration of the second embodiment shown in FIG. 10. Even in the present embodiment, a total of four gas holes 240 are formed and four openings 241 which are ends of the respective gas holes 240 are formed on the surface 210. Positions where the openings 241 are formed in a top view differ from positions where the openings 141 and the openings 142 of the dielectric substrate 100 are formed. As will be described later, the gas holes 140 and the gas holes 240 at mutually different positions are communicated by communication paths 340A provided in the joining layer 300.

Figure 18:
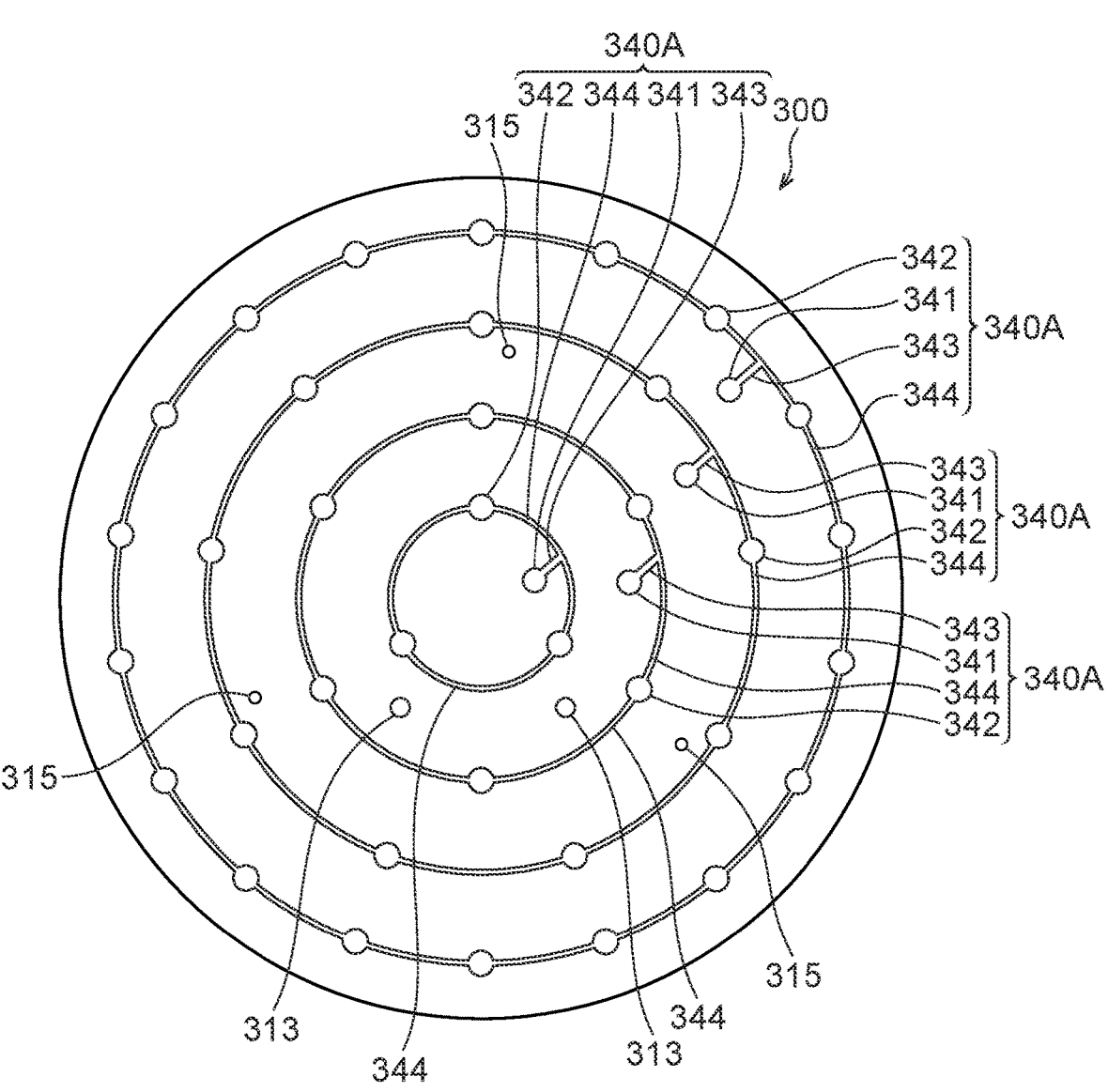
FIG. 18 is a diagram showing a configuration of a joining layer included in the electrostatic chuck shown in FIG. 17.

FIG. 18 is a diagram of only the joining layer 300 taken out from the electrostatic chuck 10 drawn as a top view. As shown in FIG. 18, a plurality of through holes are formed in the joining layer 300. The through holes include electrode holes 313, lift pin holes 315, and the communication paths 340A.

The communication paths 340A are openings provided in order to communicate the gas holes 140 and the gas holes 240 which are at mutually different positions with each other. Each communication path 340A includes an inlet part 341, an outlet part 342, and connecting parts 343 and 344.

The inlet part 341 is a portion to be an inlet when helium gas having passed through the gas hole 240 of the base plate 200 flows into the communication path 340A. As many inlet parts 341 as the number of openings 241 formed on the surface 210 of the base plate 200 are formed and the inlet parts 341 are provided at positions corresponding to the respective openings 241. In other words, the inlet parts 341 are provided at positions respectively overlapping with the openings 241 in a top view. The inlet parts 341 are approximately circular holes and an inner diameter thereof is slightly larger than the inner diameter of the openings 241.

The outlet part 342 is a portion to be an outlet of helium gas having passed through the communication path 340A. As many outlet parts 342 as the number of openings 142 formed on the surface 120 of the dielectric substrate 100 are formed and the outlet parts 263 are provided at positions corresponding to the respective openings 142. In other words, the outlet parts 342 are provided at positions respectively overlapping with the openings 142 in a top view. The outlet parts 342 are approximately circular holes and an inner diameter thereof is slightly larger than the inner diameter of the openings 142.

The connecting parts 343 and 344 are holes formed as a flow path for connecting the inlet part 341 and the outlet part 342. Among the connecting parts 343 and 344, the connecting part 344 is a flow path that extends in an arc along a circumferential direction so as to connect a plurality of outlet parts 342. The connecting part 343 is a flow path that extends linearly from the inlet part 341 to the connecting part 344 on an outer circumferential side of the inlet part 341.

In the present embodiment, a total of four communication paths 340A are formed and the communication paths 340A are arranged so as to be lined up from an outer circumferential side toward an inner circumferential side in a top view. Each communication path 340A corresponds to each of the four divided spaces SP and is provided directly under each space SP.

Figure 19:
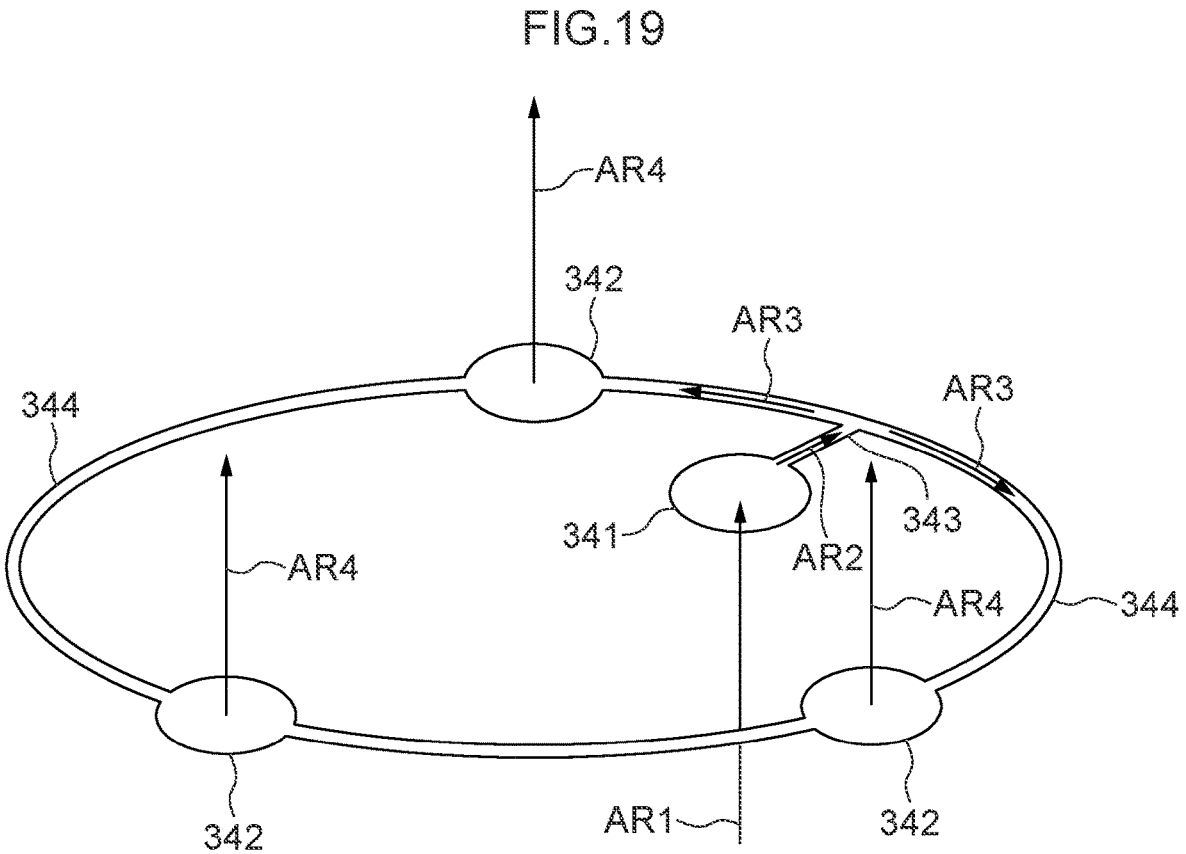
FIG. 19 is a diagram for explaining a flow of gas via a communication path on the joining layer in the electrostatic chuck shown in FIG. 17.

A flow of helium gas passing through the communication path 340A on an innermost circumferential side is schematically drawn in FIG. 19. An arrow AR1 in the diagram represents a flow of the helium gas passing through the gas hole 240 of the base plate 200. After flowing into the communication path 340A from the inlet part 341, the helium gas passes through the connecting part 343 and flows into the connecting part 344 (arrow AR2). Subsequently, the helium gas flows along the connecting part 344 (arrow AR3), flows into the gas hole 140 of the dielectric substrate 100 from each outlet part 342 (arrow AR4), and passes through the gas hole 140 to be supplied to the space SP. Helium gas flows in a similar manner in the other communication paths 340A.

As described above, in the electrostatic chuck 10 according to the present embodiment, after differentiating the position of the opening 142 (first opening) and the position of the opening 241 (second opening), the communication path 340A which communicates the opening 142 and the opening 241 with each other is formed on the joining layer 300.

Figure 20A:
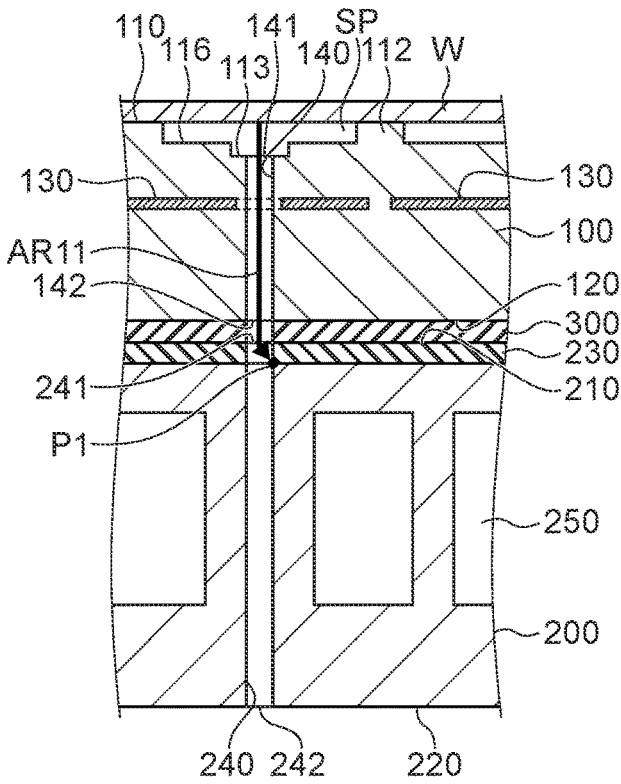
FIG. 20A is a diagram for explaining a discharge path via a gas hole.
Figure 20B:
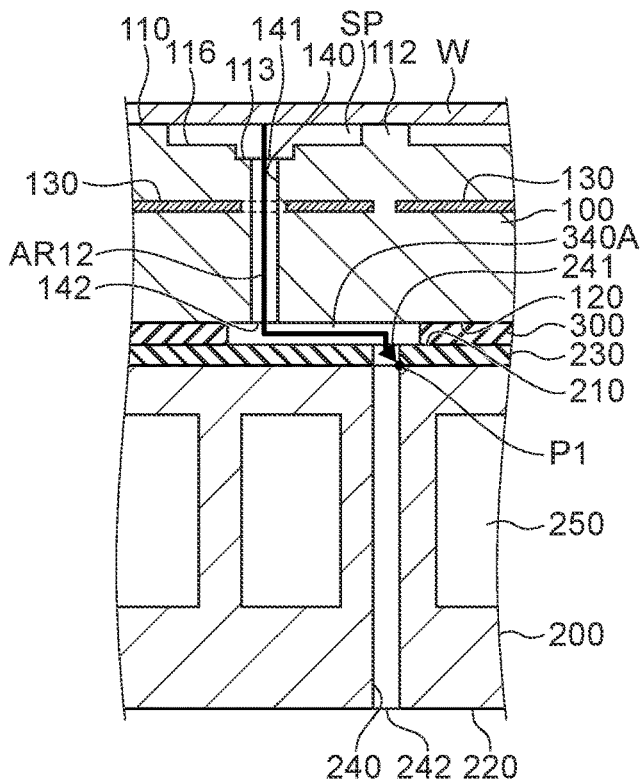
FIG. 20B is a diagram for explaining a discharge path via a gas hole.

An advantage of adopting such a configuration will be described with reference to FIG. 20A and FIG. 20B. FIG. 20A shows a configuration of an electrostatic chuck according to a comparative example. The configuration of the comparative example shown in FIG. 20A is the same as the configuration of the comparative example shown in FIG. 6A. As described earlier, in the present comparative example, since a so-called "creepage distance" is short, a discharge along an approximately linear path as indicated by an arrow AR11 relatively readily occurs.

By comparison, in the present embodiment, after differentiating the position of the opening 142 and the position of the opening 241, the communication path 340A which communicates the opening 142 and the opening 241 with each other is formed on the joining layer 300 as described above. In such a configuration, as shown in FIG. 20B, an inner surface of the gas hole 240 is never exposed toward a side of the substrate W directly under the gas hole 140. A path from metal exposed on the inner surface of the gas hole 240 through the gas hole 140 and the like to the substrate W is a bent path as indicated by an arrow AR12. Since a longer creepage distance is secured as compared to the comparative example described above, an occurrence of a discharge along the path can be sufficiently suppressed.

As shown in FIGS. 18 and 19, each communication path 340A includes one inlet part 341 and a plurality of outlet parts 342 and the inlet part 341 and the outlet parts 342 are connected to each other via connecting parts 343 and 344. As a result, in the present embodiment, one opening 241 is communicated with a plurality of the openings 142 via the communication path 340A. In such a configuration, the number of the openings 241 can be made smaller than the number of the openings 142. By reducing the number of openings 241 which may trigger a discharge, an occurrence of a discharge can be further suppressed.

Note that the number of inlet parts 341 provided in one communication path 340A may be two or more. In any case, the number of inlet parts 341 is preferably smaller than the number of outlet parts 342 in each communication path 340A.

As described earlier, the insulator film 230 is provided on the surface 210 on the side of the joining layer 300 of the base plate 200 so as to cover the entire surface 210. In such a configuration, even when the communication paths 340A are formed as through holes as in the present embodiment, a metal surface of the base plate 200 is not exposed particularly in a portion of the inner surface of the communication paths 340A directly under the openings 142. Accordingly, an occurrence of a discharge can be sufficiently suppressed. While the insulator film 230 is preferably an alumina film formed by spraying as in the present embodiment, the insulator film 230 may be a film formed by other methods or a film made of other materials.

Figure 21:
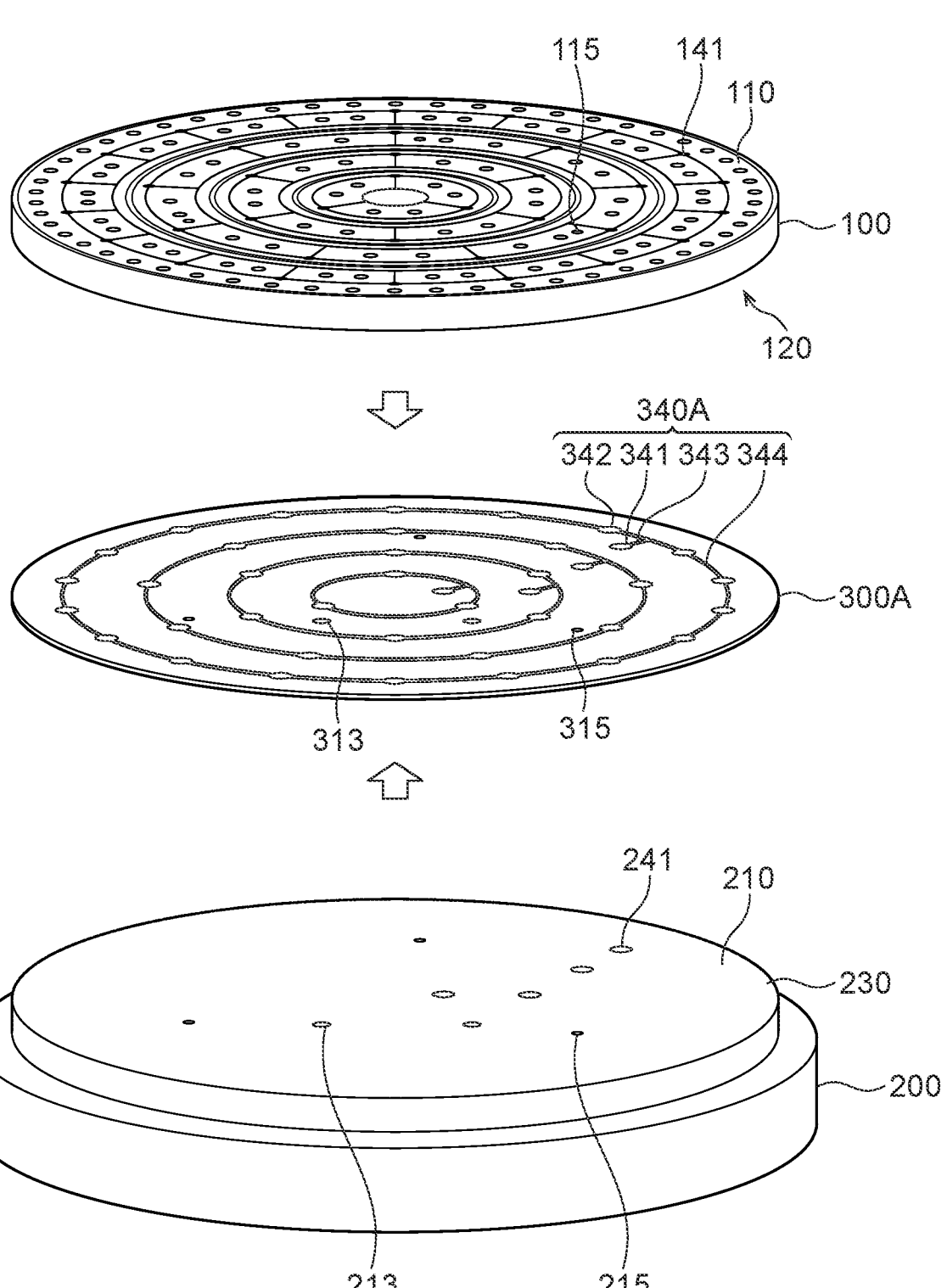
FIG. 21 is a diagram for explaining a method of manufacturing the electrostatic chuck shown in FIG. 17.

A method of manufacturing the electrostatic chuck 10 will be briefly described. First, as shown in FIG. 21, the dielectric substrate 100, the base plate 200, and the adhesive sheet 300A are respectively prepared. Subsequently, the dielectric substrate 100 and the base plate 200 are joined to each other using the adhesive sheet 300A.

The dielectric substrate 100 is in a state where the attracting electrodes 130, the gas hole 140, the seal rings 111, and the like have been formed in advance prior to joining. As methods of forming these elements, various known methods can be adopted.

In a similar manner, the base plate 200 is also in a state where the refrigerant flow paths 250, the gas holes 240, the openings 241, the insulator film 230, and the like have been formed in advance prior to joining. As methods of forming these elements, various known methods can be adopted.

The adhesive sheet 300A is an insulating member to become the joining layer 300 by being cured upon joining.

As the adhesive sheet 300A, the same adhesive sheet as in the first embodiment can be used. However, the present embodiment differs from the first embodiment in that the communication paths 340A are formed in the adhesive sheet 300A in advance in place of the communication holes 340 shown in FIG. 7 and the like.

After preparing the dielectric substrate 100, the base plate 200, and the adhesive sheet 300A provided with the communication paths 340A and the like as described above, as shown in FIG. 21, the adhesive sheet 300A is sandwiched between the dielectric substrate 100 and the base plate 200. Specifically, the surface 120 on which the opening 142 being an end of the gas hole 140 is formed on the dielectric substrate 100 and the surface 210 on which the opening 241 being an end of the gas hole 240 is formed on the base plate 200 are arranged to oppose each other and the adhesive sheet 300A is sandwiched between the dielectric substrate 100 and the base plate 200 so that the opening 142 and the opening 241 at mutually different positions are communicated with each other by the communication path 340A.

In a state where the adhesive sheet 300A is sandwiched as described above, entireties of the dielectric substrate 100, the base plate 200, and the adhesive sheet 300A are heated up to a predetermined temperature. Due to the heating, the adhesive sheet 300A is cured in a state of being joined to both the surface 120 and the surface 210 and becomes the joining layer 300 shown in FIG. 17. The through holes such as the communication paths 340A having been formed in advance in the adhesive sheet 300A more or less retain their original shapes even after the adhesive sheet 300A is cured. According to the method described above, the electrostatic chuck 10 configured as shown in FIG. 17 is manufactured.

As described above, the joining layer 300 according to the present embodiment is created by curing the solid adhesive sheet 300A on which the communication paths 340A and the like have been formed in advance. Using the adhesive sheet 300A enables the communication paths 340A with a predetermined shape to be readily formed in a stage prior to joining in a portion (the adhesive sheet 300A) to become the joining layer 300. In addition, the communication paths 340A can be reliably prevented from deforming or being blocked in the step of curing the adhesive.

If the deformation of the communication paths 340A during curing can be prevented in some way, a liquid adhesive can be used instead of the adhesive sheet 300A as the adhesive to become the joining layer 300. For example, by performing bonding after arranging, in advance, a string-like solid material to act as a "levee" for preventing penetration by a liquid adhesive along an outer periphery of regions to become the communication paths 340A, the joining layer 300 similar to the present embodiment can be formed.

Figure 22:
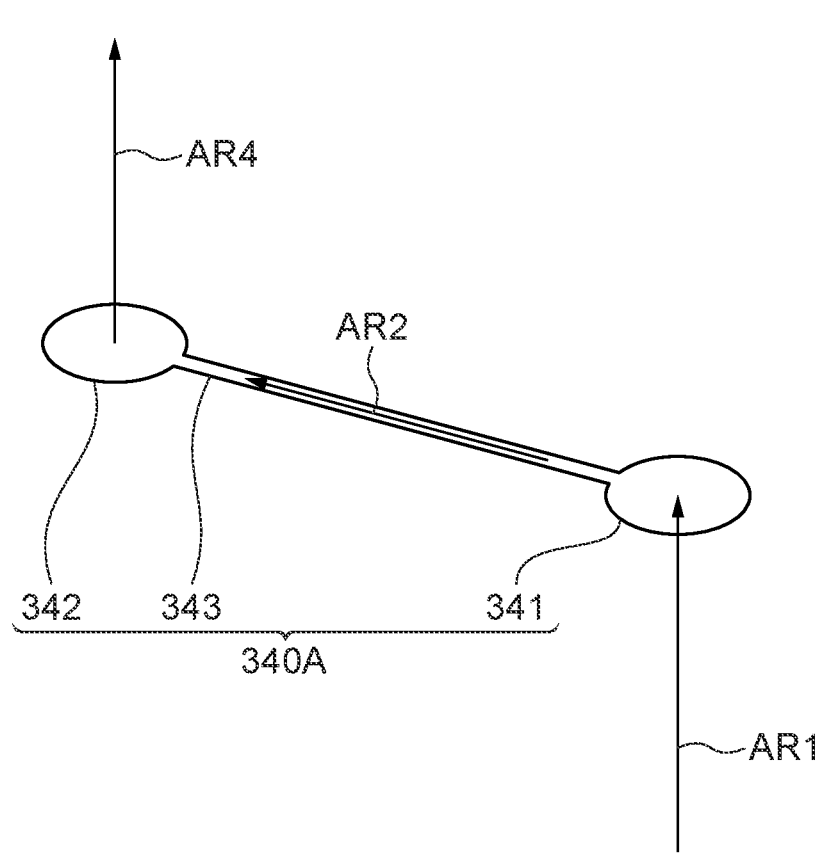
FIG. 22 is a diagram for explaining a flow of gas via a communication path on a joining layer in an electrostatic chuck according to a modification.

A shape of the communication paths 340A formed on the joining layer 300 can be changed as appropriate. The communication paths 340A of the electrostatic chuck 10 according to a modification are drawn in FIG. 22 in a similar method to FIG. 19. In the present modification, the number of gas holes 140 formed in the dielectric substrate 100 and the number of gas holes 240 formed in the base plate 200 are the same. Therefore, each communication path 340A provided on the joining layer 300 has one each of the inlet part 341 and the outlet part 342 and the inlet part 341 and the outlet part 342 are directly connected to each other by one connecting part 343. In this manner, a configuration may be adopted in which each of the openings 241 is communicated with only one opening 142 via the communication path 340A.

Figure 23:
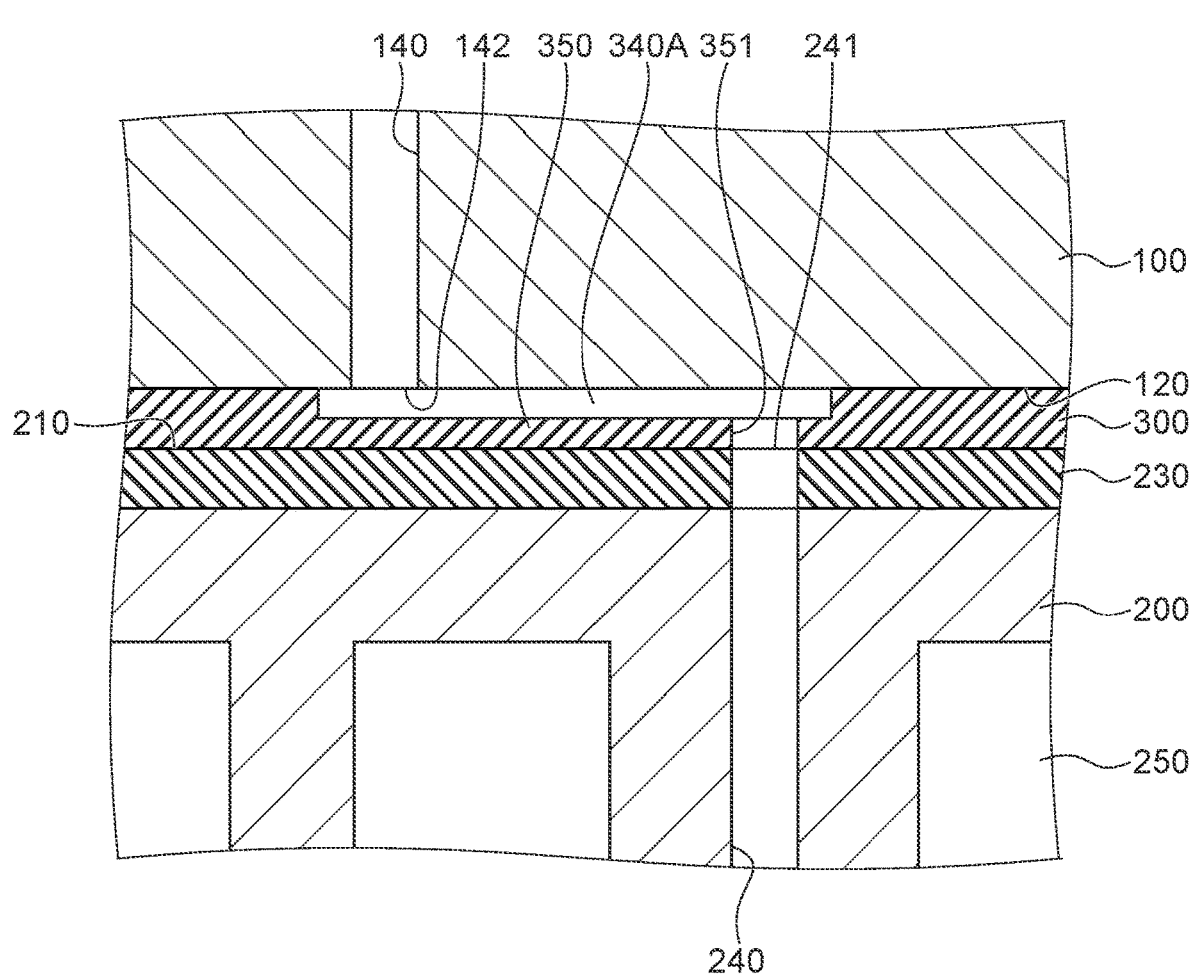
FIG. 23 is a sectional view showing a part of a configuration of an electrostatic chuck according to another modification.

FIG. 23 shows a configuration of the electrostatic chuck 10 according to another modification. This modification only differs from the present embodiment in the shape of the communication paths 340A.

In this modification, the shape of the communication paths 340A in a top view is more or less the same as the shape in the present embodiment as shown in FIG. 18. However, as shown in the cross section in FIG. 23, each of the communication paths 340A according to this comparative example is not a hole which penetrates the joining layer 300 but is formed as a recessed part which recedes toward the side of the base plate 200 from a surface of the joining layer 300 on the side of the dielectric substrate 100. In other words, the communication path 340A according to the present comparative example is formed as a "bottomed hole" which includes a bottom part 350 on the side of the base plate 200. A through hole 351 is formed in a portion of the bottom part 350 overlapping with the opening 241 in a top view.

The joining layer 300 described above can be formed by, for example, stacking an adhesive sheet on which the communication path 340A has been formed in advance and an adhesive sheet on which the through hole 351 has been formed in advance.

In such a configuration, particularly a portion to be directly under the opening 142 of the surface 210 of the base plate 200 becomes covered by the bottom part 350 which is an insulating member. Therefore, even when the insulator film 230 is thinned or omitted, an occurrence of a discharge between the substrate W and the base plate 200 can be sufficiently suppressed.

The present embodiment has been described above with reference to specific examples. However, it is to be understood that the present disclosure is not limited to the specific examples. Appropriate design modifications of the specific examples made by persons skilled in the art are also included in the scope of the present disclosure insofar as such modifications possess characteristics of the present disclosure. The respective elements included in each specific example described above and arrangements, conditions, shapes, and the like of such elements are not limited to those exemplified and can be modified as appropriate. Combinations of the respective elements included in each specific example described above can be appropriately changed insofar as no technical contradictions arise from such changes.

What is claimed is:

1. An electrostatic chuck, comprising:
a dielectric substrate on which at least one first gas hole is formed;
a base plate on which at least one second gas hole is formed; and
a joining layer which is provided between the dielectric substrate and the base plate and which is formed of an insulating material, wherein
at least one first opening being an end of the at least one first gas hole is formed on a surface of the dielectric substrate on a side of the joining layer,
at least one second opening being an end of the at least one second gas hole is formed at a position which differs from the at least one first opening on a surface of the base plate on a side of the joining layer,
a communication groove which communicates the at least one first opening and the at least one second opening with each other is formed on the surface of the base plate on the side of the joining layer, and
an insulator film provided on an inner surface of the communication groove of the base plate.

2. The electrostatic chuck according to claim 1, wherein the at least one first opening comprises a plurality of first openings, the at least one second opening comprises a plurality of second openings, and the at least one second opening is communicated with the plurality of first openings via the communication groove.

3. The electrostatic chuck according to claim 1, wherein the insulator film is a film formed by spraying.

4. The electrostatic chuck according to claim 1, wherein the joining layer is a layer created by curing a solid adhesive sheet.

5. A method of manufacturing an electrostatic chuck, comprising the steps of:
preparing a dielectric substrate on which at least one first gas hole and at least one first opening being an end of the at least one first gas hole are formed;
preparing a base plate on which at least one second gas hole and a communication groove which connects to at least one second opening being an end of the at least one second gas hole are formed;

forming an insulating film on an inner surface of the communication groove of the base plate;

preparing a solid adhesive sheet which is an insulating member;

causing a surface of the dielectric substrate on which the at least one first opening is formed and a surface of the base plate on which the at least one second opening is formed to oppose each other so that the at least one first opening and the at least one second opening at mutually different positions are communicated with each other by the communication groove and sandwiching the adhesive sheet between the dielectric substrate and the base plate; and curing the adhesive sheet.

6. An electrostatic chuck, comprising:

a dielectric substrate on which at least one first gas hole is formed;

a base plate on which at least one second gas hole is formed; and a joining layer which is provided between the dielectric substrate and the base plate and which is formed of an insulating material, wherein at least one first opening being an end of the at least one first gas hole is formed on a surface of the dielectric substrate on a side of the joining layer, at least one second opening being an end of the at least one second gas hole is formed at a position which differs from the at least one first opening on a surface of the base plate on a side of joining layer, a communication groove which communicates the at least one first opening and the at least one second opening with each other is formed on the surface of the dielectric substrate on the side of the joining layer, and an insulator film provided on the surface of the base plate on the side of the joining layer that faces the communication groove.

7. The electrostatic chuck according to claim 6, wherein the at least one first opening comprises a plurality of first openings, the at least one second opening comprises a plurality of second openings, and the at least one second opening is communicated with the plurality of first openings via the communication groove.

8. The electrostatic chuck according to claim 6, wherein the insulator film is a film formed by spraying.

9. The electrostatic chuck according to claim 6, wherein the joining layer is a layer created by curing a solid adhesive sheet.

10. A method of manufacturing an electrostatic chuck, comprising the steps of:

preparing a dielectric substrate on which at least one first gas hole and a communication groove which connects to at least one first opening being an end of the at least one first gas hole are formed;

preparing a base plate on which at least one second gas hole and at least one second opening being an end of the at least one second gas hole are formed;

forming an insulator film on a surface of the base plate on the side of the joining layer that faces the communication groove;

preparing a solid adhesive sheet which is an insulating member;

causing a surface of the dielectric substrate on which the at least one first opening is formed and a surface of the base plate on which the at least one second opening is formed to oppose each other so that the at least one first opening and the at least one second opening at mutually different positions are communicated with each other by the communication groove and sandwiching the adhesive sheet between the dielectric substrate and the base plate; and curing the adhesive sheet.

11. An electrostatic chuck, comprising:

a dielectric substrate on which at least one first gas hole is formed;

a base plate on which at least one second gas hole is formed; and a joining layer which is provided between the dielectric substrate and the base plate and which is formed of an insulating material, wherein at least one first opening being an end of the at least one first gas hole is formed on a surface of the dielectric substrate on a side of the joining layer, at least one second opening being an end of the at least one second gas hole is formed at a position which differs from the at least one first opening on a surface of the base plate on a side of the joining layer, a communication path which communicates the at least one first opening and the at least one second opening with each other is formed on the joining layer, and an insulator film provided on the surface of the base plate on the side of the joining layer.

12. The electrostatic chuck according to claim 11, wherein the at least one first opening comprises a plurality of first openings, the at least one second opening comprises a plurality of second openings, and the at least one second opening is communicated with the plurality of first openings via the communication path.

13. The electrostatic chuck according to claim 11, wherein the insulator film is a film formed by spraying.

14. The electrostatic chuck according to claim 11, wherein the joining layer is a layer created by curing a solid adhesive sheet on which the communication path has been formed in advance.

15. A method of manufacturing an electrostatic chuck, comprising the steps of:

preparing a dielectric substrate on which at least one first gas hole is formed;

preparing a base plate on which at least one second gas hole is formed;

forming an insulator film on the surface of the base plate on the side of the joining layer;

preparing a solid adhesive sheet which is an insulating member and on which a communication path has been formed in advance;

causing a surface of the dielectric substrate on which at least one first opening being an end of the at least one first gas hole is formed and a surface of the base plate on which at least one second opening being an end of the at least one second gas hole is formed to oppose each other and sandwiching the adhesive sheet between the dielectric substrate and the base plate so that the at least one first opening and the at least one second opening at mutually different positions are communicated with each other by the communication path; and curing the adhesive sheet.

* * * * *